United States Patent
Heise et al.

(10) Patent No.: US 10,017,852 B2
(45) Date of Patent: Jul. 10, 2018

(54) METHOD FOR TREATING GRAPHENE SHEETS FOR LARGE-SCALE TRANSFER USING FREE-FLOAT METHOD

(71) Applicant: Lockheed Martin Corporation, Bethesda, MD (US)

(72) Inventors: Scott E. Heise, San Jose, CA (US); Peter V. Bedworth, Los Gatos, CA (US); Jacob L. Swett, Redwood City, CA (US); Steven W. Sinton, Palo Alto, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/099,464

(22) Filed: Apr. 14, 2016

(65) Prior Publication Data
US 2017/0298504 A1    Oct. 19, 2017

(51) Int. Cl.
*C23C 16/26*  (2006.01)
*C23C 16/01*  (2006.01)
*C23C 16/56*  (2006.01)
*C23F 1/18*   (2006.01)

(52) U.S. Cl.
CPC .............. *C23C 16/26* (2013.01); *C23C 16/01* (2013.01); *C23C 16/56* (2013.01); *C23F 1/18* (2013.01)

(58) Field of Classification Search
None
See application file for complete search history.

(56) References Cited

U.S. PATENT DOCUMENTS

| | | |
|---|---|---|
| 2,187,417 A | 1/1940 | Doble |
| 3,024,153 A | 3/1962 | Kennedy |
| 3,303,085 A | 2/1967 | Price et al. |

(Continued)

FOREIGN PATENT DOCUMENTS

| | | |
|---|---|---|
| CA | 2037988 | 9/1992 |
| CA | 2411935 | 12/2002 |

(Continued)

OTHER PUBLICATIONS

Barreiro et al. "Understanding the catalyst-free transformation of amorphous carbon into graphene by current-induced annealing," Scientific Reports, 3 (Article 1115): 1-6 (Jan. 2013).

(Continued)

*Primary Examiner* — Allan Olsen
(74) *Attorney, Agent, or Firm* — Foley & Lardner LLP

(57) ABSTRACT

A method for transferring a graphene sheet from a copper substrate to a functional substrate includes forming the graphene sheet on the copper substrate using chemical vapor deposition, and irradiating the graphene sheet disposed on the copper substrate with a plurality of xenon ions using broad beam irradiation to form a prepared graphene sheet. The prepared graphene sheet is resistant to forming unintentional defects induced during transfer of the prepared graphene sheet to the functional substrate. The method further includes removing the copper substrate from the prepared graphene sheet using an etchant bath, floating the prepared graphene sheet in a floating bath, submerging the functional substrate in the floating bath, and decreasing a fluid level of the floating bath to lower the prepared graphene sheet onto the functional substrate.

37 Claims, 7 Drawing Sheets

(56) References Cited

U.S. PATENT DOCUMENTS

| | | |
|---|---|---|
| 3,501,831 A | 3/1970 | Gordon |
| 3,593,854 A | 7/1971 | Swank |
| 3,701,433 A | 10/1972 | Krakauer et al. |
| 3,802,972 A | 4/1974 | Fleischer et al. |
| 4,073,732 A | 2/1978 | Lauer et al. |
| 4,159,954 A | 7/1979 | Gangemi |
| 4,162,220 A | 7/1979 | Servas |
| 4,277,344 A | 7/1981 | Cadotte |
| 4,303,530 A | 12/1981 | Shah et al. |
| 4,743,371 A | 5/1988 | Servas et al. |
| 4,855,058 A | 8/1989 | Holland et al. |
| 4,880,440 A | 11/1989 | Perrin |
| 4,889,626 A | 12/1989 | Browne |
| 4,891,134 A | 1/1990 | Vcelka |
| 4,925,560 A | 5/1990 | Sorrick |
| 4,935,207 A | 6/1990 | Stanbro et al. |
| 4,976,858 A | 12/1990 | Kadoya |
| 5,052,444 A | 10/1991 | Messerly et al. |
| 5,080,770 A | 1/1992 | Culkin |
| 5,082,476 A | 1/1992 | Kahlbaugh et al. |
| 5,156,628 A | 10/1992 | Kranz |
| 5,182,111 A | 1/1993 | Aebischer et al. |
| 5,185,086 A | 2/1993 | Kaali et al. |
| 5,201,767 A | 4/1993 | Caldarise et al. |
| 5,244,981 A | 9/1993 | Seidner et al. |
| 5,314,492 A | 5/1994 | Hamilton et al. |
| 5,314,960 A | 5/1994 | Spinelli et al. |
| 5,314,961 A | 5/1994 | Anton et al. |
| 5,331,067 A | 7/1994 | Seidner et al. |
| 5,344,454 A | 9/1994 | Clarke et al. |
| 5,371,147 A | 12/1994 | Spinelli et al. |
| 5,425,858 A | 6/1995 | Farmer |
| 5,480,449 A | 1/1996 | Hamilton et al. |
| 5,514,181 A | 5/1996 | Light et al. |
| 5,516,522 A | 5/1996 | Peyman et al. |
| 5,549,697 A | 8/1996 | Caldarise |
| 5,562,944 A | 10/1996 | Kafrawy |
| 5,565,210 A | 10/1996 | Rosenthal et al. |
| 5,580,530 A | 12/1996 | Kowatsch et al. |
| 5,595,621 A | 1/1997 | Light et al. |
| 5,636,437 A | 6/1997 | Kaschmitter et al. |
| 5,639,275 A | 6/1997 | Baetge et al. |
| 5,641,323 A | 6/1997 | Caldarise |
| 5,658,334 A | 8/1997 | Caldarise et al. |
| 5,662,158 A | 9/1997 | Caldarise |
| 5,665,118 A | 9/1997 | LaSalle et al. |
| 5,671,897 A | 9/1997 | Ogg et al. |
| 5,679,232 A | 10/1997 | Fedor et al. |
| 5,679,249 A | 10/1997 | Fendya et al. |
| 5,687,788 A | 11/1997 | Caldarise et al. |
| 5,700,477 A | 12/1997 | Rosenthal et al. |
| 5,713,410 A | 2/1998 | LaSalle et al. |
| 5,716,412 A | 2/1998 | DeCarlo et al. |
| 5,716,414 A | 2/1998 | Caldarise |
| 5,725,586 A | 3/1998 | Sommerich |
| 5,731,360 A | 3/1998 | Pekala et al. |
| 5,733,503 A | 3/1998 | Kowatsch et al. |
| 5,746,272 A | 5/1998 | Mastrorio et al. |
| 5,782,286 A | 7/1998 | Sommerich |
| 5,782,289 A | 7/1998 | Mastrorio et al. |
| 5,788,916 A | 8/1998 | Caldarise |
| 5,800,828 A | 9/1998 | Dionne et al. |
| 5,808,312 A | 9/1998 | Fukuda |
| 5,868,727 A | 2/1999 | Barr et al. |
| 5,897,592 A | 4/1999 | Caldarise et al. |
| 5,902,762 A | 5/1999 | Mercuri et al. |
| 5,906,234 A | 5/1999 | Mastrorio et al. |
| 5,910,172 A | 6/1999 | Penenberg |
| 5,910,173 A | 6/1999 | DeCarlo et al. |
| 5,913,998 A | 6/1999 | Butler et al. |
| 5,922,304 A | 7/1999 | Unger |
| 5,925,247 A | 7/1999 | Huebbel |
| 5,932,185 A | 8/1999 | Pekala et al. |
| 5,935,084 A | 8/1999 | Southworth |
| 5,935,172 A | 8/1999 | Ochoa et al. |
| 5,954,937 A | 9/1999 | Farmer |
| 5,974,973 A | 11/1999 | Tittgemeyer |
| 5,976,555 A | 11/1999 | Liu et al. |
| 5,980,718 A | 11/1999 | Van Konynenburg et al. |
| 6,008,431 A | 12/1999 | Caldarise et al. |
| 6,013,080 A | 1/2000 | Khalili |
| 6,022,509 A | 2/2000 | Matthews et al. |
| 6,052,608 A | 4/2000 | Young et al. |
| 6,080,393 A | 6/2000 | Liu et al. |
| 6,093,209 A | 7/2000 | Sanders |
| 6,139,585 A | 10/2000 | Li |
| 6,152,882 A | 11/2000 | Prutchi |
| 6,156,323 A | 12/2000 | Verdicchio et al. |
| 6,193,956 B1 | 2/2001 | Liu et al. |
| 6,209,621 B1 | 4/2001 | Treacy |
| 6,213,124 B1 | 4/2001 | Butterworth |
| 6,228,123 B1 | 5/2001 | Dezzani |
| 6,264,699 B1 | 7/2001 | Noiles et al. |
| 6,292,704 B1 | 9/2001 | Malonek et al. |
| 6,309,532 B1 | 10/2001 | Tran et al. |
| 6,346,187 B1 | 2/2002 | Tran et al. |
| 6,375,014 B1 | 4/2002 | Garcera et al. |
| 6,426,214 B1 | 7/2002 | Butler et al. |
| 6,454,095 B1 | 9/2002 | Brisebois et al. |
| 6,455,115 B1 | 9/2002 | Demeyer |
| 6,461,622 B2 | 10/2002 | Liu et al. |
| 6,462,935 B1 | 10/2002 | Shiue et al. |
| 6,521,865 B1 | 2/2003 | Jones et al. |
| 6,532,386 B2 | 3/2003 | Sun et al. |
| 6,544,316 B2 | 4/2003 | Baker et al. |
| 6,580,598 B2 | 6/2003 | Shiue et al. |
| 6,654,229 B2 | 11/2003 | Yanagisawa et al. |
| 6,659,298 B2 | 12/2003 | Wong |
| 6,660,150 B2 | 12/2003 | Conlan et al. |
| 6,661,643 B2 | 12/2003 | Shiue et al. |
| 6,686,437 B2 | 2/2004 | Buchman et al. |
| 6,692,627 B1 | 2/2004 | Russell et al. |
| 6,695,880 B1 | 2/2004 | Roffman et al. |
| 6,699,684 B2 | 3/2004 | Ho et al. |
| 6,719,740 B2 | 4/2004 | Burnett et al. |
| 6,905,612 B2 | 6/2005 | Dorian et al. |
| 6,924,190 B2 | 8/2005 | Dennison |
| 7,014,829 B2 | 3/2006 | Yanagisawa et al. |
| 7,071,406 B2 | 7/2006 | Smalley et al. |
| 7,092,753 B2 | 8/2006 | Darvish et al. |
| 7,138,042 B2 | 11/2006 | Tran et al. |
| 7,171,263 B2 | 1/2007 | Darvish et al. |
| 7,175,783 B2 | 2/2007 | Curran |
| 7,179,419 B2 | 2/2007 | Lin et al. |
| 7,190,997 B1 | 3/2007 | Darvish et al. |
| 7,267,753 B2 | 9/2007 | Anex et al. |
| 7,306,768 B2 | 12/2007 | Chiga |
| 7,357,255 B2 | 4/2008 | Ginsberg et al. |
| 7,374,677 B2 | 5/2008 | McLaughlin et al. |
| 7,381,707 B2 | 6/2008 | Lin et al. |
| 7,382,601 B2 | 6/2008 | Yoshimitsu |
| 7,434,692 B2 | 10/2008 | Ginsberg et al. |
| 7,452,547 B2 | 11/2008 | Lambino et al. |
| 7,459,121 B2 | 12/2008 | Liang et al. |
| 7,460,907 B1 | 12/2008 | Darvish et al. |
| 7,476,222 B2 | 1/2009 | Sun et al. |
| 7,477,939 B2 | 1/2009 | Sun et al. |
| 7,477,940 B2 | 1/2009 | Sun et al. |
| 7,477,941 B2 | 1/2009 | Sun et al. |
| 7,479,133 B2 | 1/2009 | Sun et al. |
| 7,505,250 B2 | 3/2009 | Cho et al. |
| 7,531,094 B2 | 5/2009 | McLaughlin et al. |
| 7,600,567 B2 | 10/2009 | Christopher et al. |
| 7,631,764 B2 | 12/2009 | Ginsberg et al. |
| 7,650,805 B2 | 1/2010 | Nauseda et al. |
| 7,674,477 B1 | 3/2010 | Schmid et al. |
| 7,706,128 B2 | 4/2010 | Bourcier |
| 7,761,809 B2 | 7/2010 | Bukovec et al. |
| 7,786,086 B2 | 8/2010 | Reches et al. |
| 7,866,475 B2 | 1/2011 | Doskoczynski et al. |
| 7,875,293 B2 | 1/2011 | Shults et al. |
| 7,935,331 B2 | 5/2011 | Lin |
| 7,935,416 B2 | 5/2011 | Yang et al. |
| 7,943,167 B2 | 5/2011 | Kulkarni et al. |

(56) References Cited

U.S. PATENT DOCUMENTS

| | | |
|---|---|---|
| 7,960,708 B2 | 6/2011 | Wolfe et al. |
| 7,998,246 B2 | 8/2011 | Liu et al. |
| 8,109,893 B2 | 2/2012 | Lande |
| 8,147,599 B2 | 4/2012 | McAlister |
| 8,262,943 B2 | 9/2012 | Meng et al. |
| 8,278,106 B2 | 10/2012 | Martinson et al. |
| 8,308,702 B2 | 11/2012 | Batchvarova et al. |
| 8,316,865 B2 | 11/2012 | Ochs et al. |
| 8,329,476 B2 | 12/2012 | Pitkanen et al. |
| 8,354,296 B2 | 1/2013 | Dimitrakopoulos et al. |
| 8,361,321 B2 | 1/2013 | Stetson et al. |
| 8,449,504 B2 | 5/2013 | Carter et al. |
| 8,475,689 B2 | 7/2013 | Sun et al. |
| 8,506,807 B2 | 8/2013 | Lee et al. |
| 8,512,669 B2 | 8/2013 | Hauck |
| 8,513,324 B2 | 8/2013 | Scales et al. |
| 8,535,726 B2 | 9/2013 | Dai et al. |
| 8,592,291 B2 * | 11/2013 | Shi ............ C23C 16/342 257/E21.17 |
| 8,617,411 B2 | 12/2013 | Singh |
| 8,666,471 B2 | 3/2014 | Rogers et al. |
| 8,686,249 B1 | 4/2014 | Whitaker et al. |
| 8,697,230 B2 * | 4/2014 | Ago ............ B82Y 30/00 423/448 |
| 8,698,481 B2 | 4/2014 | Lieber et al. |
| 8,715,329 B2 | 5/2014 | Robinson et al. |
| 8,721,074 B2 | 5/2014 | Pugh et al. |
| 8,734,421 B2 | 5/2014 | Sun et al. |
| 8,744,567 B2 | 6/2014 | Fassih et al. |
| 8,751,015 B2 | 6/2014 | Frewin et al. |
| 8,753,468 B2 * | 6/2014 | Caldwell ........ B82Y 30/00 156/235 |
| 8,759,153 B2 | 6/2014 | Elian et al. |
| 8,808,257 B2 | 8/2014 | Pugh et al. |
| 8,828,211 B2 | 9/2014 | Garaj et al. |
| 8,840,552 B2 | 9/2014 | Brauker et al. |
| 8,857,983 B2 | 10/2014 | Pugh et al. |
| 8,861,821 B2 | 10/2014 | Osumi |
| 8,894,201 B2 | 11/2014 | Pugh et al. |
| 8,940,552 B2 | 1/2015 | Pugh et al. |
| 8,950,862 B2 | 2/2015 | Pugh et al. |
| 8,974,055 B2 | 3/2015 | Pugh et al. |
| 8,975,121 B2 | 3/2015 | Pugh et al. |
| 8,979,978 B2 | 3/2015 | Miller et al. |
| 8,986,932 B2 | 3/2015 | Turner et al. |
| 8,993,234 B2 | 3/2015 | Turner et al. |
| 8,993,327 B2 | 3/2015 | McKnight et al. |
| 9,014,639 B2 | 4/2015 | Pugh et al. |
| 9,017,937 B1 | 4/2015 | Turner et al. |
| 9,023,220 B2 | 5/2015 | Graphenea |
| 9,028,663 B2 | 5/2015 | Stetson et al. |
| 9,035,282 B2 * | 5/2015 | Dimitrakopoulos ............ H01L 29/1606 257/29 |
| 9,045,847 B2 | 6/2015 | Batchvarova et al. |
| 9,050,452 B2 | 6/2015 | Sun et al. |
| 9,052,533 B2 | 6/2015 | Pugh et al. |
| 9,056,282 B2 | 6/2015 | Miller et al. |
| 9,062,180 B2 | 6/2015 | Scales et al. |
| 9,067,811 B1 | 6/2015 | Bennett et al. |
| 9,070,615 B2 | 6/2015 | Elian et al. |
| 9,075,009 B2 * | 7/2015 | Kim ............ G01N 21/552 |
| 9,080,267 B2 | 7/2015 | Batchvarova et al. |
| 9,095,823 B2 | 8/2015 | Fleming |
| 9,096,050 B2 * | 8/2015 | Bedell ............ B32B 43/006 |
| 9,096,437 B2 * | 8/2015 | Tour ............ C01B 31/0446 |
| 9,102,111 B2 | 8/2015 | Pugh et al. |
| 9,108,158 B2 | 8/2015 | Yu et al. |
| 9,110,310 B2 | 8/2015 | Pugh et al. |
| 9,125,715 B2 | 9/2015 | Pugh et al. |
| 9,134,546 B2 | 9/2015 | Pugh et al. |
| 9,170,646 B2 | 10/2015 | Toner et al. |
| 9,185,486 B2 | 11/2015 | Pugh |
| 9,193,587 B2 | 11/2015 | Bennett |
| 9,195,075 B2 | 11/2015 | Pugh et al. |
| 9,225,375 B2 | 12/2015 | Pugh et al. |
| 9,388,048 B1 * | 7/2016 | Zhou ............ C01B 31/04 |
| 9,425,709 B2 | 8/2016 | Hayashi et al. |
| 9,437,370 B2 | 9/2016 | Chen et al. |
| 9,463,421 B2 | 10/2016 | Fleming |
| 9,505,192 B2 | 11/2016 | Stoltenberg et al. |
| 9,567,224 B2 | 2/2017 | Bedworth |
| 9,572,918 B2 | 2/2017 | Bachmann et al. |
| 9,592,475 B2 | 3/2017 | Stoltenberg et al. |
| 9,610,546 B2 | 4/2017 | Sinton et al. |
| 9,708,640 B2 | 7/2017 | Wu et al. |
| 9,713,794 B2 | 7/2017 | Choi et al. |
| 9,870,895 B2 | 1/2018 | Bedworth |
| 2001/0036556 A1 | 11/2001 | Jen |
| 2001/0047157 A1 | 11/2001 | Burnett et al. |
| 2001/0055597 A1 | 12/2001 | Liu et al. |
| 2002/0079004 A1 | 6/2002 | Sato et al. |
| 2002/0079054 A1 | 6/2002 | Nakatani |
| 2002/0104435 A1 | 8/2002 | Baker et al. |
| 2002/0115957 A1 | 8/2002 | Sun et al. |
| 2002/0117659 A1 | 8/2002 | Lieber et al. |
| 2002/0183682 A1 | 12/2002 | Darvish et al. |
| 2002/0183686 A1 | 12/2002 | Darvish et al. |
| 2003/0052354 A1 | 3/2003 | Dennison |
| 2003/0134281 A1 | 7/2003 | Evans |
| 2003/0138777 A1 | 7/2003 | Evans |
| 2003/0159985 A1 | 8/2003 | Siwy et al. |
| 2004/0035787 A1 | 2/2004 | Tanga et al. |
| 2004/0061253 A1 | 4/2004 | Kleinmeyer et al. |
| 2004/0063097 A1 | 4/2004 | Evans |
| 2004/0099324 A1 | 5/2004 | Fraser et al. |
| 2004/0111968 A1 | 6/2004 | Day et al. |
| 2004/0112865 A1 | 6/2004 | McCullough et al. |
| 2004/0121488 A1 | 6/2004 | Chang et al. |
| 2004/0142463 A1 | 7/2004 | Walker et al. |
| 2004/0185730 A1 | 9/2004 | Lambino et al. |
| 2004/0193043 A1 | 9/2004 | Duchon et al. |
| 2004/0199243 A1 | 10/2004 | Yodfat |
| 2004/0217036 A1 | 11/2004 | Ginsberg et al. |
| 2004/0241214 A1 | 12/2004 | Kirkwood et al. |
| 2004/0251136 A1 | 12/2004 | Lean et al. |
| 2005/0004508 A1 | 1/2005 | Sun et al. |
| 2005/0004509 A1 | 1/2005 | Sun et al. |
| 2005/0004550 A1 | 1/2005 | Sun et al. |
| 2005/0010161 A1 | 1/2005 | Sun et al. |
| 2005/0010192 A1 | 1/2005 | Sun et al. |
| 2005/0015042 A1 | 1/2005 | Sun et al. |
| 2005/0053563 A1 | 3/2005 | Manissier et al. |
| 2005/0112078 A1 | 5/2005 | Boddupalli et al. |
| 2005/0126966 A1 | 6/2005 | Tanida et al. |
| 2005/0129633 A1 | 6/2005 | Lin |
| 2005/0148996 A1 | 7/2005 | Sun et al. |
| 2005/0170089 A1 | 8/2005 | Lashmore et al. |
| 2005/0189673 A1 | 9/2005 | Klug et al. |
| 2005/0226834 A1 | 10/2005 | Lambino et al. |
| 2005/0238730 A1 | 10/2005 | Le Fur et al. |
| 2006/0005381 A1 | 1/2006 | Nishi et al. |
| 2006/0036332 A1 | 2/2006 | Jennings |
| 2006/0073370 A1 | 4/2006 | Krusic et al. |
| 2006/0093885 A1 | 5/2006 | Krusic et al. |
| 2006/0121279 A1 | 6/2006 | Petrik |
| 2006/0151382 A1 | 7/2006 | Petrik |
| 2006/0166347 A1 | 7/2006 | Faulstich et al. |
| 2006/0180604 A1 | 8/2006 | Ginsberg et al. |
| 2006/0222701 A1 | 10/2006 | Kulkarni et al. |
| 2006/0253078 A1 | 11/2006 | Wu et al. |
| 2007/0004640 A1 | 1/2007 | Lin et al. |
| 2007/0032054 A1 | 2/2007 | Ramaswamy et al. |
| 2007/0056894 A1 | 3/2007 | Connors, Jr. |
| 2007/0060862 A1 | 3/2007 | Sun et al. |
| 2007/0062856 A1 | 3/2007 | Pahl et al. |
| 2007/0099813 A1 | 5/2007 | Luizzi et al. |
| 2007/0131646 A1 * | 6/2007 | Donnelly ........ B29D 11/00365 216/2 |
| 2007/0284279 A1 | 12/2007 | Doskoczynski et al. |
| 2008/0017564 A1 | 1/2008 | Hammond |
| 2008/0035484 A1 | 2/2008 | Wu et al. |
| 2008/0035541 A1 | 2/2008 | Franzreb et al. |

(56) References Cited

U.S. PATENT DOCUMENTS

| | | |
|---|---|---|
| 2008/0045877 A1 | 2/2008 | Levin et al. |
| 2008/0061477 A1 | 3/2008 | Capizzo |
| 2008/0063585 A1 | 3/2008 | Smalley et al. |
| 2008/0081323 A1 | 4/2008 | Keeley et al. |
| 2008/0081362 A1 | 4/2008 | Keeley et al. |
| 2008/0149561 A1 | 6/2008 | Chu et al. |
| 2008/0156648 A1 | 7/2008 | Dudziak et al. |
| 2008/0170982 A1 | 7/2008 | Zhang et al. |
| 2008/0185293 A1 | 8/2008 | Klose et al. |
| 2008/0188836 A1 | 8/2008 | Weber et al. |
| 2008/0190508 A1 | 8/2008 | Booth et al. |
| 2008/0241085 A1 | 10/2008 | Lin et al. |
| 2008/0268016 A1 | 10/2008 | Fang et al. |
| 2008/0290020 A1 | 11/2008 | Marand et al. |
| 2008/0290111 A1 | 11/2008 | Ginsberg et al. |
| 2009/0023572 A1 | 1/2009 | Backes et al. |
| 2009/0032475 A1 | 2/2009 | Ferrer et al. |
| 2009/0039019 A1 | 2/2009 | Raman |
| 2009/0048685 A1 | 2/2009 | Frigstad et al. |
| 2009/0075371 A1 | 3/2009 | Keeley et al. |
| 2009/0078640 A1 | 3/2009 | Chu et al. |
| 2009/0087395 A1 | 4/2009 | Lin et al. |
| 2009/0117335 A1 | 5/2009 | Iyoda et al. |
| 2009/0148495 A1 | 6/2009 | Hammer et al. |
| 2009/0176159 A1 | 7/2009 | Zhamu et al. |
| 2009/0222072 A1 | 9/2009 | Robinson et al. |
| 2009/0236295 A1 | 9/2009 | Braun et al. |
| 2009/0241242 A1 | 10/2009 | Beatty et al. |
| 2009/0283475 A1 | 11/2009 | Hylton et al. |
| 2009/0291270 A1 | 11/2009 | Zettl et al. |
| 2009/0294300 A1 | 12/2009 | Kanzius et al. |
| 2009/0306364 A1 | 12/2009 | Beer et al. |
| 2010/0000754 A1 | 1/2010 | Mann et al. |
| 2010/0016778 A1 | 1/2010 | Chattopadhyay |
| 2010/0021708 A1 | 1/2010 | Kong et al. |
| 2010/0024722 A1 | 2/2010 | Ochs et al. |
| 2010/0024838 A1 | 2/2010 | Ochs et al. |
| 2010/0025330 A1 | 2/2010 | Ratto et al. |
| 2010/0055464 A1 | 3/2010 | Sung |
| 2010/0059378 A1 | 3/2010 | Elson et al. |
| 2010/0072643 A1 | 3/2010 | Pugh et al. |
| 2010/0076553 A1 | 3/2010 | Pugh et al. |
| 2010/0105834 A1 | 4/2010 | Tour et al. |
| 2010/0110372 A1 | 5/2010 | Pugh et al. |
| 2010/0124564 A1 | 5/2010 | Martinson et al. |
| 2010/0127312 A1 | 5/2010 | Grebel et al. |
| 2010/0161014 A1 | 6/2010 | Lynch et al. |
| 2010/0167551 A1 | 7/2010 | Dedontney |
| 2010/0196439 A1 | 8/2010 | Beck et al. |
| 2010/0209330 A1 | 8/2010 | Golzhauser et al. |
| 2010/0209515 A1 | 8/2010 | Chantalat et al. |
| 2010/0213079 A1 | 8/2010 | Willis |
| 2010/0224555 A1 | 9/2010 | Hoek et al. |
| 2010/0228204 A1 | 9/2010 | Beatty et al. |
| 2010/0233781 A1 | 9/2010 | Bangera et al. |
| 2010/0249273 A1 | 9/2010 | Scales et al. |
| 2010/0258111 A1 | 10/2010 | Shah et al. |
| 2010/0323177 A1 | 12/2010 | Ruoff et al. |
| 2010/0327847 A1 | 12/2010 | Leiber et al. |
| 2011/0014217 A1 | 1/2011 | Fahmy et al. |
| 2011/0037033 A1 | 2/2011 | Green et al. |
| 2011/0041519 A1 | 2/2011 | McAlister |
| 2011/0041687 A1 | 2/2011 | Diaz et al. |
| 2011/0045523 A1 | 2/2011 | Strano et al. |
| 2011/0054418 A1 | 3/2011 | Pugh et al. |
| 2011/0054576 A1 | 3/2011 | Robinson et al. |
| 2011/0056892 A1 | 3/2011 | Lancaster |
| 2011/0073563 A1 | 3/2011 | Chang et al. |
| 2011/0092054 A1 | 4/2011 | Seo et al. |
| 2011/0092949 A1 | 4/2011 | Wang |
| 2011/0100921 A1 | 5/2011 | Heinrich |
| 2011/0112484 A1 | 5/2011 | Carter et al. |
| 2011/0118655 A1 | 5/2011 | Fassih et al. |
| 2011/0120970 A1 | 5/2011 | Joo et al. |
| 2011/0124253 A1 | 5/2011 | Shah et al. |
| 2011/0132834 A1 | 6/2011 | Tomioka et al. |
| 2011/0139707 A1 | 6/2011 | Siwy et al. |
| 2011/0152795 A1 | 6/2011 | Aledo et al. |
| 2011/0201201 A1 | 8/2011 | Arnold et al. |
| 2011/0202201 A1 | 8/2011 | Matsubara |
| 2011/0253630 A1 | 10/2011 | Bakajin et al. |
| 2011/0258791 A1 | 10/2011 | Batchvarova et al. |
| 2011/0258796 A1 | 10/2011 | Batchvarova et al. |
| 2011/0262645 A1 | 10/2011 | Batchvarova et al. |
| 2011/0263912 A1 | 10/2011 | Miller et al. |
| 2011/0269920 A1 | 11/2011 | Min et al. |
| 2012/0000845 A1 | 1/2012 | Park et al. |
| 2012/0031833 A1 | 2/2012 | Ho et al. |
| 2012/0048804 A1 | 3/2012 | Stetson et al. |
| 2012/0115243 A1 | 5/2012 | Pitkanen et al. |
| 2012/0116228 A1 | 5/2012 | Okubo |
| 2012/0145548 A1 | 6/2012 | Sivan et al. |
| 2012/0148633 A1 | 6/2012 | Sun et al. |
| 2012/0162600 A1 | 6/2012 | Pugh et al. |
| 2012/0183738 A1 | 7/2012 | Zettl et al. |
| 2012/0186850 A1 | 7/2012 | Sugiyama et al. |
| 2012/0211367 A1 | 8/2012 | Vecitis |
| 2012/0218508 A1 | 8/2012 | Pugh et al. |
| 2012/0220053 A1 | 8/2012 | Lee et al. |
| 2012/0234453 A1 | 9/2012 | Pugh et al. |
| 2012/0234679 A1 | 9/2012 | Garaj et al. |
| 2012/0235277 A1 | 9/2012 | Pugh et al. |
| 2012/0236254 A1 | 9/2012 | Pugh et al. |
| 2012/0236524 A1 | 9/2012 | Pugh et al. |
| 2012/0241371 A1 | 9/2012 | Revanur et al. |
| 2012/0242953 A1 | 9/2012 | Pugh et al. |
| 2012/0255899 A1 | 10/2012 | Choi et al. |
| 2012/0267337 A1 | 10/2012 | Striemer et al. |
| 2012/0292245 A1 | 11/2012 | Saito |
| 2012/0298396 A1 | 11/2012 | Hong et al. |
| 2012/0301707 A1 | 11/2012 | Kinloch et al. |
| 2013/0015136 A1 | 1/2013 | Bennett |
| 2013/0034760 A1 | 2/2013 | Otts et al. |
| 2013/0045523 A1 | 2/2013 | Leach et al. |
| 2013/0056367 A1 | 3/2013 | Martinez et al. |
| 2013/0071941 A1 | 3/2013 | Miller |
| 2013/0096292 A1 | 4/2013 | Brahmasandra et al. |
| 2013/0100436 A1 | 4/2013 | Jackson et al. |
| 2013/0105417 A1 | 5/2013 | Stetson et al. |
| 2013/0108839 A1 | 5/2013 | Arnold et al. |
| 2013/0116541 A1 | 5/2013 | Gracias et al. |
| 2013/0131214 A1 | 5/2013 | Scales et al. |
| 2013/0135578 A1 | 5/2013 | Pugh et al. |
| 2013/0146221 A1* | 6/2013 | Kolmakov .......... B32B 38/0004 156/252 |
| 2013/0146480 A1 | 6/2013 | Garaj et al. |
| 2013/0152386 A1 | 6/2013 | Pandojirao-S et al. |
| 2013/0174978 A1 | 7/2013 | Pugh et al. |
| 2013/0190476 A1 | 7/2013 | Lancaster et al. |
| 2013/0192460 A1 | 8/2013 | Miller et al. |
| 2013/0192461 A1 | 8/2013 | Miller et al. |
| 2013/0194540 A1 | 8/2013 | Pugh et al. |
| 2013/0213568 A1 | 8/2013 | Pugh et al. |
| 2013/0215377 A1 | 8/2013 | Pugh et al. |
| 2013/0215378 A1 | 8/2013 | Pugh et al. |
| 2013/0215380 A1 | 8/2013 | Pugh et al. |
| 2013/0216581 A1 | 8/2013 | Fahmy et al. |
| 2013/0240355 A1 | 9/2013 | Ho et al. |
| 2013/0240437 A1 | 9/2013 | Rodrigues et al. |
| 2013/0248097 A1 | 9/2013 | Ploss, Jr. |
| 2013/0248367 A1 | 9/2013 | Stetson et al. |
| 2013/0249147 A1 | 9/2013 | Bedworth |
| 2013/0256118 A1 | 10/2013 | Meller et al. |
| 2013/0256139 A1 | 10/2013 | Peng |
| 2013/0256154 A1 | 10/2013 | Peng |
| 2013/0256210 A1 | 10/2013 | Fleming |
| 2013/0256211 A1 | 10/2013 | Fleming |
| 2013/0261568 A1 | 10/2013 | Martinson et al. |
| 2013/0269819 A1 | 10/2013 | Ruby et al. |
| 2013/0270188 A1 | 10/2013 | Karnik et al. |
| 2013/0273288 A1 | 10/2013 | Luo et al. |
| 2013/0277305 A1 | 10/2013 | Stetson et al. |
| 2013/0295150 A1 | 11/2013 | Chantalat et al. |

(56) References Cited

U.S. PATENT DOCUMENTS

| | | | |
|---|---|---|---|
| 2013/0309776 A1* | 11/2013 | Drndic | G01N 27/26 436/94 |
| 2013/0317131 A1 | 11/2013 | Scales et al. | |
| 2013/0317132 A1 | 11/2013 | Scales et al. | |
| 2013/0317133 A1 | 11/2013 | Scales et al. | |
| 2013/0323295 A1 | 12/2013 | Scales et al. | |
| 2013/0338611 A1 | 12/2013 | Pugh et al. | |
| 2013/0338744 A1 | 12/2013 | Frewin et al. | |
| 2014/0002788 A1 | 1/2014 | Otts et al. | |
| 2014/0005514 A1 | 1/2014 | Pugh et al. | |
| 2014/0015160 A1 | 1/2014 | Kung et al. | |
| 2014/0017322 A1 | 1/2014 | Dai et al. | |
| 2014/0048411 A1 | 2/2014 | Choi et al. | |
| 2014/0066958 A1 | 3/2014 | Priewe | |
| 2014/0079936 A1* | 3/2014 | Russo | G01N 33/48721 428/220 |
| 2014/0093728 A1 | 4/2014 | Shah et al. | |
| 2014/0128891 A1 | 5/2014 | Astani-Matthies et al. | |
| 2014/0141521 A1 | 5/2014 | Peng et al. | |
| 2014/0151288 A1 | 6/2014 | Miller et al. | |
| 2014/0151631 A1* | 6/2014 | Duesberg | G01N 27/129 257/9 |
| 2014/0154464 A1 | 6/2014 | Miller et al. | |
| 2014/0170195 A1 | 6/2014 | Fassih et al. | |
| 2014/0171541 A1 | 6/2014 | Scales et al. | |
| 2014/0174927 A1 | 6/2014 | Bashir et al. | |
| 2014/0190004 A1 | 7/2014 | Riall et al. | |
| 2014/0190550 A1* | 7/2014 | Loh | H01L 51/445 136/244 |
| 2014/0190676 A1 | 7/2014 | Zhamu et al. | |
| 2014/0190833 A1 | 7/2014 | Lieber et al. | |
| 2014/0192313 A1 | 7/2014 | Riall et al. | |
| 2014/0192314 A1 | 7/2014 | Riall et al. | |
| 2014/0199777 A2 | 7/2014 | Ruiz et al. | |
| 2014/0209539 A1 | 7/2014 | El Badawi et al. | |
| 2014/0212596 A1* | 7/2014 | Jahangiri-Famenini | B82Y 30/00 427/551 |
| 2014/0230653 A1 | 8/2014 | Yu et al. | |
| 2014/0230733 A1 | 8/2014 | Miller | |
| 2014/0231351 A1 | 8/2014 | Wickramasinghe et al. | |
| 2014/0248621 A1 | 9/2014 | Collins | |
| 2014/0257348 A1 | 9/2014 | Priewe et al. | |
| 2014/0257515 A1 | 9/2014 | So et al. | |
| 2014/0257517 A1 | 9/2014 | Deichmann et al. | |
| 2014/0259657 A1 | 9/2014 | Riall et al. | |
| 2014/0261999 A1 | 9/2014 | Stetson et al. | |
| 2014/0263035 A1 | 9/2014 | Stoltenberg et al. | |
| 2014/0263178 A1 | 9/2014 | Sinton et al. | |
| 2014/0264977 A1 | 9/2014 | Pugh et al. | |
| 2014/0268015 A1 | 9/2014 | Riall et al. | |
| 2014/0268020 A1 | 9/2014 | Pugh et al. | |
| 2014/0268021 A1 | 9/2014 | Pugh et al. | |
| 2014/0268026 A1 | 9/2014 | Pugh et al. | |
| 2014/0272286 A1 | 9/2014 | Stoltenberg et al. | |
| 2014/0272522 A1 | 9/2014 | Pugh et al. | |
| 2014/0273315 A1 | 9/2014 | Pugh et al. | |
| 2014/0273316 A1 | 9/2014 | Pugh et al. | |
| 2014/0276481 A1 | 9/2014 | Pugh et al. | |
| 2014/0276999 A1 | 9/2014 | Harms et al. | |
| 2014/0306361 A1 | 10/2014 | Pugh et al. | |
| 2014/0308681 A1 | 10/2014 | Strano et al. | |
| 2014/0315213 A1 | 10/2014 | Nagrath et al. | |
| 2014/0318373 A1 | 10/2014 | Wood et al. | |
| 2014/0322518 A1 | 10/2014 | Addleman et al. | |
| 2014/0333892 A1 | 11/2014 | Pugh et al. | |
| 2014/0335661 A1 | 11/2014 | Pugh et al. | |
| 2014/0343580 A1 | 11/2014 | Priewe | |
| 2014/0346081 A1 | 11/2014 | Sowden et al. | |
| 2014/0349892 A1* | 11/2014 | Van Der Zaag | G01N 33/48721 506/38 |
| 2014/0350372 A1 | 11/2014 | Pugh et al. | |
| 2014/0377651 A1 | 12/2014 | Kwon et al. | |
| 2014/0377738 A1 | 12/2014 | Bachmann et al. | |
| 2015/0015843 A1 | 1/2015 | Pugh et al. | |
| 2015/0017918 A1 | 1/2015 | Pugh et al. | |
| 2015/0053627 A1 | 2/2015 | Silin et al. | |
| 2015/0057762 A1 | 2/2015 | Harms et al. | |
| 2015/0061990 A1 | 3/2015 | Toner et al. | |
| 2015/0062533 A1 | 3/2015 | Toner et al. | |
| 2015/0063605 A1 | 3/2015 | Pugh | |
| 2015/0066063 A1 | 3/2015 | Priewe | |
| 2015/0075667 A1 | 3/2015 | McHugh et al. | |
| 2015/0077658 A1 | 3/2015 | Pugh et al. | |
| 2015/0077659 A1 | 3/2015 | Pugh et al. | |
| 2015/0077660 A1 | 3/2015 | Pugh et al. | |
| 2015/0077661 A1 | 3/2015 | Pugh et al. | |
| 2015/0077662 A1 | 3/2015 | Pugh et al. | |
| 2015/0077663 A1 | 3/2015 | Pugh et al. | |
| 2015/0077699 A1 | 3/2015 | De Sio et al. | |
| 2015/0077702 A9 | 3/2015 | Pugh et al. | |
| 2015/0079683 A1 | 3/2015 | Yager et al. | |
| 2015/0087249 A1 | 3/2015 | Pugh et al. | |
| 2015/0096935 A1 | 4/2015 | Mitra et al. | |
| 2015/0098910 A1 | 4/2015 | Mordas et al. | |
| 2015/0101931 A1 | 4/2015 | Garaj et al. | |
| 2015/0105686 A1 | 4/2015 | Vasan | |
| 2015/0118318 A1 | 4/2015 | Fahmy et al. | |
| 2015/0122727 A1 | 5/2015 | Karnik et al. | |
| 2015/0138454 A1 | 5/2015 | Pugh et al. | |
| 2015/0142107 A1 | 5/2015 | Pugh et al. | |
| 2015/0145155 A1 | 5/2015 | Pugh et al. | |
| 2015/0146162 A1 | 5/2015 | Pugh et al. | |
| 2015/0147474 A1 | 5/2015 | Batchvarova et al. | |
| 2015/0170788 A1 | 6/2015 | Miller et al. | |
| 2015/0174253 A1 | 6/2015 | Sun et al. | |
| 2015/0174254 A1 | 6/2015 | Sun et al. | |
| 2015/0182473 A1 | 7/2015 | Bosnyak et al. | |
| 2015/0185180 A1 | 7/2015 | Ruhl et al. | |
| 2015/0196579 A1 | 7/2015 | Ferrante et al. | |
| 2015/0202351 A1 | 7/2015 | Kaplan et al. | |
| 2015/0212339 A1 | 7/2015 | Pugh et al. | |
| 2015/0217219 A1 | 8/2015 | Sinsabaugh et al. | |
| 2015/0218210 A1 | 8/2015 | Stetson et al. | |
| 2015/0221474 A1 | 8/2015 | Bedworth | |
| 2015/0231557 A1 | 8/2015 | Miller et al. | |
| 2015/0231577 A1 | 8/2015 | Nair et al. | |
| 2015/0247178 A1 | 9/2015 | Mountcastle et al. | |
| 2015/0258254 A1 | 9/2015 | Simon et al. | |
| 2015/0258498 A1 | 9/2015 | Simon et al. | |
| 2015/0258502 A1 | 9/2015 | Turowski | |
| 2015/0258503 A1 | 9/2015 | Sinton et al. | |
| 2015/0258525 A1 | 9/2015 | Westman et al. | |
| 2015/0268150 A1 | 9/2015 | Newkirk et al. | |
| 2015/0272834 A1 | 10/2015 | Sun et al. | |
| 2015/0272896 A1 | 10/2015 | Sun et al. | |
| 2015/0273401 A1 | 10/2015 | Miller et al. | |
| 2015/0309337 A1 | 10/2015 | Flitsch et al. | |
| 2015/0321147 A1 | 11/2015 | Fleming et al. | |
| 2015/0321149 A1 | 11/2015 | McGinnis | |
| 2015/0323811 A1 | 11/2015 | Flitsch et al. | |
| 2015/0336202 A1 | 11/2015 | Bedworth et al. | |
| 2015/0342900 A1 | 12/2015 | Putnins | |
| 2015/0346382 A1 | 12/2015 | Bliven et al. | |
| 2015/0351887 A1 | 12/2015 | Peters | |
| 2015/0359742 A1 | 12/2015 | Fassih et al. | |
| 2015/0378176 A1 | 12/2015 | Flitsch et al. | |
| 2016/0009049 A1 | 1/2016 | Stoltenberg et al. | |
| 2016/0038885 A1 | 2/2016 | Hogen-Esch et al. | |
| 2016/0043384 A1 | 2/2016 | Zhamu et al. | |
| 2016/0058932 A1 | 3/2016 | Stetson et al. | |
| 2016/0059190 A1 | 3/2016 | Yoo et al. | |
| 2016/0067390 A1 | 3/2016 | Simon et al. | |
| 2016/0074814 A1 | 3/2016 | Park et al. | |
| 2016/0074815 A1 | 3/2016 | Sinton et al. | |
| 2016/0256805 A1 | 9/2016 | Grein et al. | |
| 2016/0272499 A1 | 9/2016 | Graphenea | |
| 2016/0282326 A1 | 9/2016 | Waduge et al. | |
| 2016/0284811 A1* | 9/2016 | Yu | H01L 29/454 |
| 2016/0339160 A1 | 11/2016 | Bedworth et al. | |
| 2017/0000937 A1 | 1/2017 | Gottschalk | |
| 2017/0032962 A1 | 2/2017 | Graphenea | |
| 2017/0035943 A1 | 2/2017 | Simon et al. | |

(56) References Cited

U.S. PATENT DOCUMENTS

| | | |
|---|---|---|
| 2017/0036916 A1 | 2/2017 | Bedworth et al. |
| 2017/0037356 A1* | 2/2017 | Simon .................. C12M 41/46 |
| 2017/0057812 A1 | 3/2017 | Graphenea |
| 2017/0065939 A1 | 3/2017 | Kim et al. |
| 2017/0202885 A1 | 7/2017 | Agulnick |
| 2017/0239623 A1 | 8/2017 | Stoltenberg et al. |
| 2017/0296972 A1 | 10/2017 | Sinton et al. |
| 2017/0296976 A1 | 10/2017 | Liu et al. |
| 2017/0296979 A1 | 10/2017 | Swett et al. |

FOREIGN PATENT DOCUMENTS

| | | |
|---|---|---|
| CN | 1128501 A | 8/1996 |
| CN | 101108194 A | 1/2008 |
| CN | 101243544 | 8/2008 |
| CN | 101428198 A | 5/2009 |
| CN | 101489653 A | 7/2009 |
| CN | 101996853 A | 3/2011 |
| CN | 102242062 A | 11/2011 |
| CN | 102344132 | 2/2012 |
| CN | 102423272 | 4/2012 |
| CN | 102592720 A | 7/2012 |
| CN | 101996853 B | 8/2012 |
| CN | 102637584 A | 8/2012 |
| CN | 103153441 | 6/2013 |
| CN | 103182249 A | 7/2013 |
| CN | 203235358 | 10/2013 |
| CN | 103480281 | 1/2014 |
| CN | 103585891 | 2/2014 |
| CN | 103603706 A | 2/2014 |
| DE | 19536560 | 3/1997 |
| DE | 10 2005 049 388 A1 | 4/2007 |
| EP | 0 364 628 A1 | 4/1990 |
| EP | 1 034 251 | 1/2004 |
| EP | 1 777 250 A1 | 4/2007 |
| EP | 1 872 812 | 1/2008 |
| EP | 2 060 286 | 5/2009 |
| EP | 2 107 120 A1 | 10/2009 |
| EP | 2 230 511 A1 | 9/2010 |
| EP | 1 603 609 | 5/2011 |
| EP | 2 354 272 | 8/2011 |
| EP | 2 450 096 | 5/2012 |
| EP | 2 489 520 | 8/2012 |
| EP | 2 511 002 | 10/2012 |
| EP | 2 586 473 | 5/2013 |
| EP | 2 679 540 | 1/2014 |
| EP | 2 937 313 | 10/2015 |
| EP | 3 070 053 | 9/2016 |
| EP | 3 084 398 | 10/2016 |
| EP | 1 538 2430.5 | 3/2017 |
| EP | 3 135 631 | 3/2017 |
| JP | 59-102111 | 7/1984 |
| JP | 10-510471 | 5/1995 |
| JP | 7504120 | 5/1995 |
| JP | 2001-232158 | 8/2001 |
| JP | 2002-126510 | 5/2002 |
| JP | 2004-179014 | 6/2004 |
| JP | 2005-126966 | 5/2005 |
| JP | 2006-188393 | 7/2006 |
| JP | 2009-291777 | 12/2009 |
| JP | 2011-168448 A | 9/2011 |
| JP | 2011-241479 | 12/2011 |
| JP | 2012-500708 | 1/2012 |
| JP | 2004-202480 | 7/2014 |
| JP | 2015-503405 | 2/2015 |
| JP | 2016-175828 | 10/2016 |
| KR | 1020110084110 | 7/2011 |
| KR | 10-2012-0022164 A | 3/2012 |
| KR | 1020120022164 A | 3/2012 |
| KR | 1020140002570 | 1/2014 |
| WO | WO-93/33901 | 3/1993 |
| WO | WO-93/12859 | 8/1993 |
| WO | WO-95/00231 | 1/1995 |
| WO | WO-97/12664 A1 | 4/1997 |
| WO | WO-98/30501 A2 | 7/1998 |
| WO | WO-00/70012 | 11/2000 |
| WO | WO-02/055539 A1 | 7/2002 |
| WO | WO-2013/115762 | 8/2003 |
| WO | WO-2004/009840 A1 | 1/2004 |
| WO | WO-2004/082733 | 9/2004 |
| WO | WO-2005/047857 A2 | 5/2005 |
| WO | WO-2007/103411 A2 | 9/2007 |
| WO | WO-2007/140252 A1 | 12/2007 |
| WO | WO-2008/008533 | 1/2008 |
| WO | WO-2009/129984 A1 | 10/2009 |
| WO | WO-2010/006080 | 1/2010 |
| WO | WO-2010/115904 A1 | 10/2010 |
| WO | WO-2011/019686 A1 | 2/2011 |
| WO | WO-2011/046706 A1 | 4/2011 |
| WO | WO-2011/001674 | 6/2011 |
| WO | WO-2011/063458 A1 | 6/2011 |
| WO | WO-2011/075158 | 6/2011 |
| WO | WO-2011/094204 A2 | 8/2011 |
| WO | WO-2011/100458 A2 | 8/2011 |
| WO | WO-2011/138689 A2 | 11/2011 |
| WO | WO-2012/006657 A1 | 1/2012 |
| WO | WO-2012/021801 A2 | 2/2012 |
| WO | WO-2012/027148 A1 | 3/2012 |
| WO | WO-2012/028695 | 3/2012 |
| WO | WO-2012/030368 A1 | 3/2012 |
| WO | WO 2012/125770 | 9/2012 |
| WO | WO-2012/138671 A2 | 10/2012 |
| WO | WO-2012/142852 A1 | 10/2012 |
| WO | WO-2013/016445 A1 | 1/2013 |
| WO | WO-2013/048063 A1 | 4/2013 |
| WO | WO-2013/138137 A1 | 9/2013 |
| WO | WO-2013/138698 A1 | 9/2013 |
| WO | WO-2013/151799 | 10/2013 |
| WO | WO-2013/152179 A1 | 10/2013 |
| WO | WO-2014/084861 A1 | 6/2014 |
| WO | WO-2014/168629 A1 | 10/2014 |
| WO | WO-2015/030698 A1 | 3/2015 |
| WO | WO-2015/138736 A1 | 9/2015 |
| WO | WO-2015/138752 A1 | 9/2015 |
| WO | WO-2015/138771 A1 | 9/2015 |
| WO | WO-2015/197217 | 12/2015 |
| WO | WO-2016/102003 | 6/2016 |

OTHER PUBLICATIONS

Botari et al., "Graphene healing mechanisms: A theoretical investigation," Carbon, 99: 302-309 (Apr. 2016) (published online Dec. 2015).
Chen et al., "Defect Scattering in Graphene," Physical Review Letters, 102: 236805-1-236805-4 (Jun. 2009).
Chen et al., "Self-healing of defected graphene," Applied Physics Letters, 102(10): 103107-1-103107-5 (Mar. 2013).
Cheng et al., "Ion Transport in Complex Layered Graphene-Based Membranes with Tuneable Interlayer Spacing," Science Advances, 2(2): e1501272 (9 pages) (Feb. 2016).
Crock et al., "Polymer Nanocomposites with Graphene-Based Hierarchical Fillers as Materials for Multifunctional Water Treatment Membranes," Water Research, 47(12): 3984-3996 (Aug. 2013) (published online Mar. 2013).
Han et al., "Ultrathin Graphene Nanofiltration Membrane for Water Purification," Advanced Functional Materials, 23(29): 3693-3700 (Aug. 2013).
International Search Report and Written Opinion in PCT/US2016/027583 mailed Jan. 13, 2017.
Written Opinion in PCT/US2016/027590 mailed Jan. 6, 2017.
International Search Report and Written Opinion in PCT/US2016/027594 mailed Jan. 13, 2017.
International Search Report and Written Opinion in PCT/US2016/027628 mailed Jan. 9, 2017.
International Search Report and Written Opinion in PCT/US2016/027631 mailed Jan. 13, 2017.
International Search Report and Written Opinion in PCT/US2016/027632 mailed Jan. 9, 2017.
Written Opinion in PCT/US2016/052010 mailed Dec. 20, 2016.
International Search Report in PCT/US2016/027629 mailed Dec. 8, 2016.

(56) References Cited

OTHER PUBLICATIONS

International Search Report in PCT/US2016/052007 mailed Dec. 27, 2016.
Kjeldsen, T., "Yeast secretory expression of insulin precursors," Appl Microbiol Biotechnol, 54: 277-286 (May 2000).
Lin et al., "A Direct and Polymer-Free Method for Transferring Graphene Grown by Chemical Vapor Deposition to Any Substrate," ACSNANO, 8(2): 1784-1791 (Jan. 2014).
Liu et al. "Synthesis of high-quality monolayer and bilayer graphene on copper using chemical vapor deposition," Carbon, 49(13): 4122-4130 (Nov. 2011) (published online May 2011).
O'Hern et al., "Nanofiltration across defect-sealed nanoporous monolayer graphene," Nano Letters, 15(5): 3254-3260 (Apr. 2015).
US Corrected Notice of Allowance in U.S. Appl. No. 13/480,569 mailed May 26, 2015.
US Notice of Allowance for U.S. Appl. No. 14/610,770 dated Apr. 25, 2016.
US Notice of Allowance in U.S. Appl. No. 14/819,273 mailed Dec. 14, 2016.
US Notice of Allowance in U.S. Appl. No. 13/480,569 mailed Feb. 27, 2015.
US Office Action in U.S. Appl. No. 13/480,569 mailed Jul. 30, 2014.
US Office Action in U.S. Appl. No. 14/856,471 mailed Dec. 1, 2016.
US Restriction Requirement in U.S. Appl. No. 14/193,007 mailed Jul. 17, 2015.
Wang et al., "Graphene Oxide Membranes with Tunable Permeability due to Embedded Carbon Dots," Chemical Communications, 50(86): 13089-13092 (Nov. 2014) (published online Sep. 2014).
Xu et al., "Graphene Oxide-$TiO_2$ Composite Filtration Membranes and their Potential Application for Water Purification," Carbon, 62: 465-471 (Oct. 2013) (published online Jun. 2013).
Zhao et al., "A glucose-responsive controlled release of insulin system based on enzyme multilayers-coated mesoporous silica particles," Chem. Commun., 47: 9459-9461 (Jun. 2011).
Adiga et al., "Nanoporous Materials for Biomedical Devices," JOM 60: 26-32 (Mar. 25, 2008).
AMI Applied Membranes Inc. (undated). FilmTec Nanofiltration Membrane Elements. Retrieved Jun. 1, 2016, from http://www.appliedmembranes.com/filmtec-nanofiltration-membrane-elements.html.
Apel, "Track etching technique in membrane technology," Radiation Measurements 34(1-6): 559-566 (Jun. 2001).
Bae et al., "Roll-to-roll production of 30-inch graphene films for transparent electrodes," Nature Nanotechnology 5: 574-578 (Jun. 20, 2010).
Bai et al., "Graphene nanomesh," Nature Nanotechnology 5: 190-194 (Feb. 14, 2010).
Baker. (2004). "Track-etch Membranes." In Membrane Technology and Applications (2nd ed., pp. 92-94). West Sussex, England: John Wiley & Sons.
Butler et al. "Progress, Challenges, and Opportunities in Two-Dimensional Materials Beyond Graphene", Materials Review 7(4): 2898-2926 (Mar. 6, 2013).
Chhowalla et al., "The chemistry of two-dimensional layered transition metal dichalcogenide nanosheets," Nature Chemistry 5: 263-275 (Mar. 20, 2013).
Childres et al., "Effect of oxygen plasma etching on graphene studied using Raman spectroscopy and electronic transport measurements," New Journal of Physics 13 (Feb. 10, 2011).
Clochard. (undated). Radiografted track-etched polymer membranes for research and application [Scholarly project]. In Laboratoire Des Solides Irradiés. Retrieved Jun. 2, 2016, from http://iramis.cea.fr/radiolyse/5juin2015/Clochard.pdf.
Cohen-Tanugi et al, "Water Desalination across Nanoporous Graphene," ACS Nano Letters 12(7): 3602-3608 (Jun. 5, 2012).
Cohen-Tanugi, "Nanoporous graphene as a water desalination membrane," Thesis: Ph.D., Massachusetts Institute of Technology, Department of Materials Science and Engineering (Jun. 2015).
Colton, "Implantable biohybrid artificial organs," Cell Transplantation 4(4): 415-436 (Jul.-Aug. 1995).

Desai et al., "Nanoporous microsystems for islet cell replacement," Advanced Drug Delivery Reviews 56: 1661-1673 (Jul. 23, 2004).
Fischbein et al., "Electron beam nanosculpting of suspended graphene sheets," Applied Physics Letters 93(113107): 1-3, (Sep. 16, 2008).
Fissell et al., "High-Performance Silicon Nanopore Hemofiltration Membranes," NIH-PA Author Manuscript, PMC, (Jan. 5, 2010), also published in J. Memb. Sci. 326(1): 58-63 (Jan. 5, 2009).
Gimi et al., "A Nanoporous, Transparent Microcontainer for Encapsulated Islet Therapy," J. Diabetes Sci. Tech. 3(2): 1-7 (Mar. 2009).
International Search Report dated Dec. 4, 2015, in related international application PCT/US2015/048205.
International Search Report dated Jun. 10, 2015, from related international application PCT/US15/20201.
Jiang et al., "Porous Graphene as the Ultimate Membrane for Gas Separation," Nano Letters 9(12): 4019-4024 (Sep. 23, 2009).
Joshi et al., "Precise and ultrafast molecular sieving through graphene oxide membranes", Science 343(6172): 752-754 (Feb. 14, 2014).
Kanani et al., "Permeability—Selectivity Analysis for Ultrafiltration: Effect of Pore Geometry," NIH-PA Author Manuscript, PMC, (Mar. 1, 2011), also published in J. Memb. Sci. 349(1-2): 405 (Mar. 1, 2010).
Karan et al., "Ultrafast Viscous Permeation of Organic Solvents Through Diamond-Like Carbon Nanosheets," Science 335: 444-447 (Jan. 27, 2012).
Kim et al., "Fabrication and Characterization of Large Area, Semiconducting Nanoperforated Graphene Materials," Nano Letters 10(4): 1125-1131 (Mar. 1, 2010).
Kim et al., "The structural and electrical evolution of graphene by oxygen plasma-induced disorder," Nanotechnology IOP 20(375703): 1-8 (Aug. 26, 2009).
Koski and Cui, "The New Skinny in Two-Dimensional Nanomaterials", ACS Nano 7(5): 3739-3743 (May 16, 2013).
Liu et al., "Atomically Thin Molybdenum Disulfide Nanopores with High Sensitivity for DNA Translocation," ACS Nano 8(3): 2504-2511 (Feb. 18, 2014).
Liu et al., "Graphene Oxidation: Thickness-Dependent Etching and Strong Chemical Doping," Nano Letters 8(7): 1965-1970 (Jun. 19, 2008).
Mishra et al., "Functionalized Graphene Sheets for Arsenic Removal and Desalination of Sea Water," Desalination 282: 39-45 (Nov. 1, 2011).
Morse, "Scalable Synthesis of Semiconducting Nanopatterned Graphene Materials," InterNano Resources for Nanomanufacturing (undated). Retrieved Jun. 2, 2016 from: http://www.internano.org/node/345.
Nair et al., "Unimpeded Permeation of Water Through Helium-Leak-tight Graphene-Based Membranes," Science 335: 442-444 (Jan. 27, 2012).
O'Hern et al. "Selective Molecular Transport through Intrinsic Defects in a Single Layer of CVD Graphene," ACS Nano, 6(11): 10130-10138 (Oct. 2, 2012).
O'Hern et al., "Selective Ionic Transport through Tunable Subnanometer Pores in Single-Layer Graphene Membranes," Nano Letters 14(3): 1234-1241 (Feb. 3, 2014).
Paul, "Creating New Types of Carbon-Based Membranes," Science 335: 413-414 (Jan. 27, 2012).
Schweicher et al., "Membranes to achieve immunoprotection of transplanted islets," NIH-PA Author Manuscript, PMC, (Nov. 13, 2014), also published in Frontiers in Bioscience (Landmark Ed) 19: 49-76 (Jan. 1, 2014).
Sint et al., "Selective Ion Passage through Functionalized Graphene Nanopores," JACS 130: 16448-16449 (Nov. 14, 2008).
Suk et al., "Water Transport Through Ultrathin Graphene," Journal of Physical Chemistry Letters 1(10): 1590-1594 (Apr. 30, 2010).
Tan et al., "Beta-cell regeneration and differentiation: how close are we to the 'holy grail'?" J. Mol. Encodrinol. 53(3): R119-R129 (Dec. 1, 2014).
Vlassiouk et al., "Versatile ultrathin nanoporous silicon nitride membranes," Proc. Natl. Acad. Sci. USA 106(50): 21039-21044 (Dec. 15, 2009).

(56) References Cited

OTHER PUBLICATIONS

Wadvalla, "Boosting agriculture through seawater," Nature Middle East (Jul. 2, 2012). Retrieved Jun. 1, 2016 from: natureasia.com/en/nmiddleeast/article/10.1038/nmiddleeast.2012.92?WT.mc_id=FBK NatureMEast].
Wikipedia, "Ion track." Jun. 1, 2016. Retrieved Jun. 1, 2016 from: en.wikipedia.org/wiki/ion_track.
Xu et al., "Graphene-like Two-Dimensional Materials", Chemical Reviews 113: 3766-3798 (Jan. 3, 2013).
Zan et al., "Graphene Reknits Its Holes," Nano Lett. 12(8): 3936-3940 (Jul. 5, 2012).
Zhao et al. "Two-Dimensional Material Membranes: An Emerging Platform for Controllable Mass Transport Applications," Small 10(22): 4521-4542 (Sep. 10, 2014).
Allen et al., "Craters on silicon surfaces created by gas cluster ion impacts," Journal of Applied Physics, 92(7): 3671-3678 (Oct. 2002).
Atmeh et al., "Albumin Aggregates: Hydrodynamic Shape and Physico-Chemical Properties," Jordan Journal of Chemistry, 2(2): 169-182 (2007).
Chen et al., "Mechanically Strong, Electrically Conductive, and Biocompatible Graphene Paper," Adv. Mater., 20(18): 3557-3561 (Sep. 2008) (available online Jul. 2008).
CN Office Action in Chinese Application No. 201380013988.9 mailed Aug. 18, 2016 (English translation not readily available).
Fuertes, "Carbon composite membranes from Matrimid® and Kapton® polyimides for gas separation," Microporous and Mesoporous Materials, 33: 115-125 (1991).
Galashev, "Computer study of the removal of Cu from the graphene surface using Ar clusters," Computational Materials Science, 98: 123-128 (Feb. 2015) (available online Nov. 2014).
International Search Report and Written Opinion in PCT/US2015/013599 mailed Jul. 20, 2015.
International Search Report and Written Opinion in PCT/US2015/013805 mailed Apr. 30, 2015.
International Search Report and Written Opinion in PCT/US2015/018114 mailed Jun. 3, 2015.
International Search Report and Written Opinion in PCT/US2015/020246 mailed Jun. 10, 2015.
International Search Report and Written Opinion in PCT/US2015/020296 mailed Jun. 17, 2015.
International Search Report and Written Opinion in PCT/US2015/028948 mailed Jul. 16, 2015.
International Search Report and Written Opinion in PCT/US2015/029932 mailed Oct. 6, 2015.
Inui et al., "Molecular dynamics simulations of nanopore processing in a graphene sheet by using gas cluster ion beam," Appl. Phys. A, 98: 787-794 (Mar. 2010) (available online Dec. 2009).
Koh et al., "Sensitive NMR Sensors Detect Antibodies to Influenza," NIH PA Author Manuscript PMC (Apr. 2009), also published in Angew. Chem. Int'l Engl, 47(22): 4119-4121 (May 2008) (available online Apr. 2008).
Lehtinen et al., "Cutting and controlled modification of graphene with ion beams," Nanotechnology, 22: 175306 (8 pages) (Mar. 2011).
Matteucci et al., "Transport of gases and Vapors in Glass and Rubbery Polymers," in Materials Science of Membranes for Gas and Vapor Separation. (Yampolskii et al., eds. 2006) (available online Jun. 2006).
O'Hern et al., "Development of process to transfer large areas of LPCVD graphene from copper foil to a porous support substrate," 1-62 (M.S. Thesis, Massachusetts Institute of Technology, Thesis) (Sep. 2011).
Plant et al. "Size-dependent propagation of Au nanoclusters through few-layer graphene," Nanoscale, 6: 1258-1263 (2014) (available online Oct. 2013).
Popok. "Cluster Ion Implantation in Graphite and Diamond: Radiation Damage and Stopping of Cluster Constituents," Reviews on Advanced Materials Science, 38(1): 7-16 (2014).

Russo et al., "Atom-by-atom nucleation and growth of graphene nanopores," PNAS 109(16): 5953-5957 (Apr. 2012).
US Notice of Allowance in U.S. Appl. No. 14/610,770 mailed Aug. 12, 2016.
US Office Action in U.S. Appl. No. 14/656,190 mailed Aug. 29, 2016.
US Office Action for U.S. Appl. No. 14/656,580 dated Jun. 2, 2016.
US Office Action in U.S. Appl. No. 14/819,273 mailed Jul. 6, 2016.
US Office Action for U.S. Appl. No. 14/856,198 dated Jun. 3, 2016.
Yoon, "Simulations show how to turn graphene's defects into assets," ScienceDaily (Oct. 4, 2016), www.sciencedaily.com/releases/2016/10/161004120428.htm.
Zabihi et al., "Formation of nanopore in a suspended graphene sheet with argon cluster bombardment: A molecular dynamics simulation study," Nuclear Instruments and Methods in Physics Research B, 343: 48-51: (Jan. 2015) (available online Nov. 2014).
Zhang et al. Modern Thin-Film Technology 284-285 (Metallurgical Industry Press, 1st ed. 2009) (English translation not readily available).
Zhao et al. (2012), "Effect of SiO2 substrate on the irradiation-assisted manipulation of supported graphene: a molecular dynamics study," Nanotechnology 23(28): 285703 (Jul. 2012) (available online Jun. 2012).
Zhao et al. (May 2012), "Drilling Nanopores in Graphene with Clusters: A Molecular Dynamics Study," J. Phys. Chem. C, 116(21): 11776-11178 (2012) (available online May 2012).
Baker. (2004). Track-etch Membranes. In Membrane Technology and Applications (2nd ed., pp. 92-94). West Sussex, England: John Wiley & Sons.
Notice of Allowance for U.S. Appl. No. 14/819,273 dated Oct. 28, 2016.
US Office Action for U.S. Appl. No. 14/193,007 dated Oct. 21, 2016.
US Office Action for U.S. Appl. No. 14/193,007 dated Dec. 21, 2015.
US Office Action for U.S. Appl. No. 14/193,007 dated Jul. 1, 2016.
Dong et al., "Growth of large-sized graphene thin-films by liquid precursor-based chemical vapor deposition under atmospheric pressure," Carbon 49(11): 3672-3678 (May 2011).
Hong et al., "Graphene multilayers as gates for multi-week sequential release of proteins from surfaces," NIH-PA Author Manuscript PMC (Jun. 1, 2014), also published in ACS Nano, Jan. 24, 2012; 6(1): 81-88 (first published online Dec. 29, 2011).
Hu et al., "Enabling graphene oxide nanosheets as water separation membranes," Environmental Science & Technology, 47(8): 3715-3723 (Mar. 14, 2013).
International Search Report and Written Opinion of the International Searching Authority dated Jul. 22, 2016, from related international patent application PCT/US2016/027607.
International Search Report and Written Opinion of the International Searching Authority dated Jul. 22, 2016, from related international patent application PCT/US2016/027616.
International Search Report and Written Opinion of the International Searching Authority dated Jul. 22, 2016, from related PCT application PCT/US2016/027596.
International Search Report and Written Opinion of the International Searching Authority dated Jul. 22, 2016, from related PCT application PCT/US2016/027603.
International Search Report and Written Opinion of the International Searching Authority dated Jul. 22, 2016, from related PCT application PCT/US2016/027610.
International Search Report and Written Opinion of the International Searching Authority dated Jul. 22, 2016, from related PCT application PCT/US2016/027612.
International Search Report and Written Opinion of the International Searching Authority dated Jun. 22, 2016, from related PCT application PCT/US2016/027637.
Kurapati et al., "Graphene oxide based multilayer capsules with unique permeability properties: facile encapsulation of multiple drugs," Chemical Communication 48: 6013-6015 (Apr. 25, 2012).
Li et al., "3D graphene oxide-polymer hydrogel: near-infrared light-triggered active scaffold for reversible cell capture and on-demand release," Advanced Materials 25: 6737-6743 (Oct. 7, 2013).

(56) References Cited

OTHER PUBLICATIONS

Marquardt et al., "Hybrid materials of platinum nanoparticles and thiol-functionalized graphene derivatives," Carbon 66: 285-294 (Jan. 2014; first published online Sep. 12, 2013).
Nam et al., "Monodispersed PtCo nanoparticles on hexadecyltrimethylammonium bromide treated graphene as an effective oxygen reduction reaction catalyst for proton exchange membrane fuel cells," Carbon 50: 3739-3747 (Aug. 2012; first published online Apr. 5, 2012).
Nandamuri et al., "Chemical vapor deposition of graphene films," Nanotechnology 21(14): 1-4 (Mar. 10, 2010).
Nayini et al., "Synthesis and characterization of functionalized carbon nanotubes with different wetting behaviors and their influence on the wetting properties of carbon nanotubes/polymethylmethacrylate coatings," Progress in Organic Coatings 77(6): 1007-1014 (Mar. 2014).
Sun et al., "Growth of graphene from solid carbon sources," Nature 468(7323): 549-552 (Nov. 25, 2010; including corrigendum in Nature 471(7336): 124 (Mar. 2011).
Tang et al., "Highly wrinkled cross-linked graphene oxide membranes for biological and charge-storage applications," Small 8(3): 423-431 (Feb. 6, 2012; first published online Dec. 13, 2011).
US Notice of Allowance in U.S. Appl. No. 14/610,770 mailed Jan. 23, 2017.
US Notice of Allowance in U.S. Appl. No. 14/856,198 mailed Feb. 10, 2017.
US Notice of Allowance in U.S. Appl. No. 14/856,198 mailed Mar. 1, 2017.
US Office Action in U.S. Appl. No. 14/609,325 mailed Feb. 16, 2017.
US Office Action in U.S. Appl. No. 14/193,007 mailed Mar. 23, 2017.
US Office Action in U.S. Appl. No. 14/656,580 mailed Feb. 9, 2017.
US Office Action in U.S. Appl. No. 14/843,944 mailed Jan. 6, 2017.
AE Search and Examination Report for United Arab Emirates Application No. P186/13 dated Oct. 4, 2016.
Agenor et al., "Renal tubular dysfunction in human visceral leishmaniasis (Kala-azar)," Clinical Nephrology 71(5): 492-500 (May 2009) (available online Mar. 21, 2011).
Albert et al., "Ringer's lactate is compatible with the rapid infusion of AS-3 preserved packed red blood cells," Can. J. Anaesth. 56(5): 352-356 (May 2009) (available online Apr. 2, 2009).
Aluru et al. "Modeling electronics on the nanoscale." Handbook of nanoscience, engineering and technology Goddard W, Brenner D, Lyshevski S, Iafrate GJ (2002): 11-1.
Alvarenga, "Carbon nanotube materials for aerospace wiring" Rochester Institute of Technology, 2010.
AMI Applied Membranes Inc., "Filmtec Nanofiltration Membrane Elements", Retrieved from appliedmembranes.com/nanofiltration_elements.htm, accessed Apr. 25, 2015 (2 Pages).
Aso et al., "Comparison of serum high-molecular weight (HMW) adiponectin with total adiponectin concentrations in type 2 diabetic patients with coronary artery using a novel enzyme-linked immunosorbent assay to detect HMW adiponectin," Diabetes 55(7): 1954-1960 (Jul. 2006).
AU Examination Report for Australian Patent Application No. 2013235234, dated Jan. 13, 2017, 4 pages.
AU Examination Report for Australian Patent Application No. 2013363283, dated Jun. 20, 2017, 4 pages.
AU Notice of Acceptance for Australian Application No. 2011293742 dated Jan. 13, 2016.
Axelsson et al., "Acute hyperglycemia induces rapid, reversible increases in glomerular permeability in nondiabetic rats," AM. J. Physiol. Renal Physiol. 298(6): F1306-F1312 (Jun. 2010) (available online Mar. 17, 2010).
Bains et al., "Novel lectins from rhizomes of two Acorus species with mitogenic activity and inhibitory potential towards murine cancer cell lines," Int'l Immunopharmacol. 5(9): 1470-1478 (Aug. 2005) (available online May 12, 2005).
Baker, "Membrane Technology and Applications", Membrane Technology and Applications; Apr. 14, 2004; pp. 92-94.
Barreiro et al. "Transport properties of graphene in the high-current limit." Physical review letters 103.7 (2009): 076601.
Bazargani et al. "Low molecular weight heparin improves peritoneal ultrafiltration and blocks complement and coagulation," Peritoneal Dialysis Int'l 25(4): 394-404 (Jul. 2005-Aug 2005).
Bazargani, "Acute inflammation in peritoneal dialysis: experimental studies in rats. Characterization of regulatory mechanisms," Swedish Dental J. Supp. 171: 1-57, i (2005).
Beppu et al., "Antidiabetic effects of dietary administration of Aloe arborescens Miller components on multiple low-dose streptozotocin-induced diabetes in mice: investigation on hypoglycemic action and systemic absorption dynamics of aloe components," J. Ethnopharmacol. 103(3): 468-77 (Feb. 20, 2006) (available online Jan. 6, 2006).
Bieri et al. "Two-dimensional Polymer Formation on Surfaces: Insight into the Roles of Precursor Mobility and Reactivity" JACS, 2010, vol. 132, pp. 16669-16676.
Bruin et al., "Maturation and function of human embryonic stem cell-derived pancreatic progenitors in macroencapsulation devices following transplant into mice", Diabetologia (2013), vol. 56: 1987-1998 (Jun. 16, 2013).
Chu Ju, et al. "Modern Biotechnology" East China University of Technology Press, (Sep. 2007), vol. 1; pp. 306-307, ISBN 978-7-5628-2116-8.
Clochard, "Track-Etched Polymer Membranes," Laboratory of Irradiated Solids, Ecole Polytechnique, retrieved from http://www.lsi.polytechnique.fr/home/research/physics-and-chemistry-of-nano-objects/trac . . . , Accessed Jul. 30, 2015 (2 pages).
CN Notification of Grant for Chinese Application No. 201180049184.5 dated Jun. 6, 2016.
CN Office Action for Chinese Application No. 201380014845.X dated Jul. 8, 2016.
CN Office Action for Chinese Application No. 201380014845.X dated Sep. 2, 2015.
CN Office Action for Chinese Application No. 201380019165.5 dated Aug. 25, 2015.
CN Office Action for Chinese Application No. 201380073141.X dated Jun. 8, 2016.
CN Office Action for Chinese Application No. 201380073141.X dated Mar. 21, 2017.
CN Office Action for Chinese Application No. 201480015372.X dated Aug. 2, 2016.
CN Office Action for Chinese Application No. 20118004918.5 dated Jun. 15, 2015.
CN Office Action for Chinese Application No. 201180049184.5 dated Jul. 30, 2014.
CN Office Action for Chinese Application No. 201180049184.5 dated Mar. 4, 2016.
CN Office Action for Chinese Application No. 201380014845.X dated Dec. 23, 2016.
CN Office Action for Chinese Application No. 201380017644.5 dated Feb. 7, 2017.
CN Office Action for Chinese Application No. 201380017644.5 dated May 26, 2016.
CN Office Action for Chinese Application No. 201380017644.5 dated Sep. 29, 2015.
CN Office Action in Chinese Application No. 201380013988.9 dated Oct. 27, 2015.
CN Office Action in Chinese Application No. 201580006829.5 dated Aug. 1, 2017 (English translation) (5 pages).
Daniel et al. "Implantable Diagnostic Device for Cancer Monitoring." Biosens Bioelectricon. 24(11): 3252-3257 (Jul. 15, 2009).
Database WPI, Week 201238, Thomson Scientific, London, GB; AN 2012-D49442.
De Lannoy et al., "Aquatic Biofouling Prevention by Electrically Charged Nanocomposite Polymer Thin Film Membranes", 2013 American Water Work Association membrane Technology Conference; Environmental science & technology 47.6 (2013): 2760-2768.

(56) References Cited

OTHER PUBLICATIONS

Deng et al., "Renal protection in chronic kidney disease: hypoxia-inducible factor activation vs. angiotensin II blockade," Am. J. Physiol. Renal Physiol. 299(6): F1365-F1373 (Dec. 2010) (available online Sep. 29, 2010).
Edwards, "Large Sheets of Graphene Film Produced for Transparent Electrodes (w/ Video)"; (Jun. 21, 2010), PhysOrg.com, retrieved on May 15, 2017 from https://phys.org/news/2010-06-large-sheets-graphene-transparentelectrodes.html (2 pages).
EP Office Action for European Application No. 13715529.7 dated Jun. 24, 2016.
EP Office Action for European Application No. 15743307.9 dated Aug. 8, 2017. (17 pages).
European Search Report dated Aug. 28, 2017 from related EP application 15743750.0 (7 pages).
Fayerman, "Canadian scientists use stem cells to reverse diabetes in mice", The Telegraph-Journal (New Brunswick), 1-2 (Jun. 29, 2012).
Fayerman, "Diabetes reversed in mice; University of B.C. scientists use embryonic stem cells to deal with Type 1 disease", The Vancouver Sun (British Columbia), 1-2 (Jun. 28, 2012).
Fejes et al. "A review of the properties and CVD synthesis of coiled carbon nanotubes." Materials 3.4 (2010): 2618-2642.
Franzen, C. "MIT Setting Up Industrial-Scale Graphene Printing Press" Sep. 23, 2011, retrieved from http://talkingpointsmemo.com/idealab/mit-setting-up-industrial-scale-graphene-printing-press (2 pages).
Freedman et al., "Genetic basis of nondiabetic end-stage renal disease," Semin. Nephrol. 30(2): 101-110 (Mar. 2010).
Garcia-Lopez et al., "Determination of high and low molecular weight molecules of icodextrin in plasma and dialysate, using gel filtration chromatography, in peritoneal dialysis patients," Peritoneal Dialysis Int'l 25(2): 181-191 (Mar. 2005-Apr. 2005).
Georgakilas et al., "Functionalization of Graphene: Covalent and Non-Covalent Approaches, Derivatives and Applications," Chem. Rev., (2012) 112(11), pp. 6156-6214.
Gnudi "Molecular mechanisms of proteinuria in diabetes," Biochem. Soc. Trans. 36(5): 946-949 (Oct. 2008).
Gotloib et al., "Peritoneal dialysis in refractory end-stage congestive heart failure: a challenge facing a no-win situation," Nephrol. Dialysis. Transplant. 20(Supp. 7): vii32-vii36 (Jul. 2005).
Harvey "Carbon as conductor: a pragmatic view." Proceedings of the 61st IWCS Conference, http://www.iwcs.org/archives/56333-iwcs-2012b-1.1584632. vol. 1. 2012.
Hashimoto et al. "Direct evidence for atomic defects in graphene layers." Nature 430.7002 (2004): 870-873.
He, et al. "The attachment of Fe3 O4 nanoparticles to graphene oxide by covalent bonding." Carbon 48.11 (2010): 3139-3144.
Hone et al. "Graphene has record-breaking strength" Physicsworld.com, Jul. 17, 2008.
Huang et al., "Gene expression profile in circulating mononuclear cells afterexposure to ultrafine carbon particles," Inhalation Toxicol. 22(10): 835-846 (Aug. 2010).
Humplik, et al. "Nanostructured materials for water desalination." Nanotechnology 22.29 (2011): 292001.
International Search Report and Written Opinion dated Aug. 14, 2017 from related PCT application PCT/US2017/031537 (12 pages).
International Search Report and Written Opinion dated Jan. 5, 2012 for related International Application No. PCT/US11/47800.
International Search Report and Written Opinion dated Jul. 5, 2017 from related PCT application PCT/US2017/024147.
International Search Report and Written Opinion dated Mar. 12, 2014 for International Application No. PCT/US2013/074942.
International Search Report and Written Opinion for International Application No. PCT/US2011/047800 dated Jan. 5, 2012.
International Search Report and Written Opinion for PCT Application No. PCT/US2014/023027 dated Jun. 26, 2014.
International Search Report and Written Opinion in International Application No. PCT/US2013/030344 dated Jun. 19, 2013.
International Search Report and Written Opinion in International Application No. PCT/US2013/033035 dated Jun. 28, 2013.
International Search Report and Written Opinion in International Application No. PCT/US2013/033400, dated Jun. 28, 2013.
International Search Report and Written Opinion in International Application No. PCT/US2013/033403 dated Jun. 28, 2013.
International Search Report and Written Opinion in PCT/US2014/041766, dated Sep. 30, 2014.
International Search Report and Written Opinion dated Jun. 5, 2014 in International Application No. PCT/US2014/021677.
International Search Report and Written Opinion dated Jun. 6, 2014 in International Application No. PCT/US2014/023043.
International Search Report and Written Opinion dated Dec. 16, 2014, for International Application No. PCT/US2014/051011.
International Search Report and Written Opinion dated Jun. 19, 2015, in International Application No. PCT/US2015/020287.
Inui et al. "Molecular dynamics simulations of nanopore processing in a graphene sheet by using gas cluster ion beam." Applied Physics A: Materials Science & Processing 98.4 (2010): 787-794.
Israelachvili, "Intermolecular and Surface Forces," 3rd ed., Chap. 7.1, Sizes of Atoms, Molecules, and Ions, 2011, 1 page.
Jiang, L. et al., Design of advanced porous grapheme materials: from grapheme nanomesh to 3D architectures. Nanoscale, Oct. 16, 2013, vol. 6, pp. 1922-1945.
Jiao et al., "Castration differentially alters basal and leucine-stimulated tissue protein synthesis in skeletal muscle and adipose tissue," Am. J. Physiol. Endocrinol. Metab. 297(5): E1222-1232 (Nov. 2009) (available online Sep. 15, 2009).
JP Office Action in Japanese Application No. 2015-501729 dated Dec. 9, 2016 (English translation).
JP Office Action in Japanese Application No. 2015-501729 dated Jun. 20, 2017 (English translation).
JP Office Action in Japanese Application No. 2015-501867 dated Oct. 11, 2016 (English translation).
JP Office Action in Japanese Application No. 2015-503405 dated Jun. 28, 2017 (English translation) (6 pages).
JP Office Action in Japanese Application No. 2015-503405 dated Nov. 14, 2016 (English translation).
JP Office Action in Japanese Application No. 2015-503406 dated Dec. 6, 2016(English translation).
JP Office Action in Japanese Application No. 2015-549508 dated Jun. 27, 2017 (English translation).
Kang et al., "Effect of eplerenone, enalapril and their combination treatment on diabetic nephropathy in type II diabetic rats," Nephrol. Dialysis Transplant. 24(1): 73-84 (Jan. 2009).
Kang et al., "Efficient Transfer of Large-Area Graphene Films onto Rigid Substrates by Hot Pressing," American Chemical Society Nano, 6(6): 5360-5365(May 28, 2012).
Kar et al., "Effect of glycation of hemoglobin on its interaction with trifluoperazine," Protein J. 25(3): 202-211 (Apr. 2006) (available online Jun. 6, 2006).
Kawamoto et al., "Serum high molecular weight adiponectin is associated with mild renal dysfunction in Japanese adults," J. Atherosclerosis Thrombosis 17(11): 1141-1148 (Nov. 27, 2011).
Khun et al. "From Microporous Regular Frameworks to Mesoporous Materials with Ultrahigh Surface Area: Dynamic reorganization of Porous Polymer Networks" JACS, 2008; vol. 130; pp. 13333-13337.
Krupka et al., "Measurements of the Sheet Resistance and Conductivity of Thin Epitaxial Graphene and SiC Films" Applied Physics Letters 96, 082101-I; Feb. 23, 2010.
Kumar et al., "Modulation of alpha-crystallin chaperone activity in diabetic rat lens by curcumin," Molecular Vision 11: 561-568 (Jul. 26, 2005).
Lathuiliere et al., "Encapsulated Cellular Implants for Recombinant Protein Delivery and Therapeutic Modulation of the Immune System," Journal of Applied Physics, Int. J. Mol. Sci., 16: 10578-10600 (May 8, 2015).
Lee, et al. "Measurement of the elastic properties and intrinsic strength of monolayer graphene." science 321.5887 (2008): 385-388.
Li, R.H. "Materials for immunoisolated cell transplantation". Adv. Drug Deliv. Rev. 33, 87-109 (1998).

(56) References Cited

OTHER PUBLICATIONS

Lucchese et al. "Quantifying ion-induced defects and Raman relaxation length in graphene." Carbon 48.5 (2010): 1592-1597.
Macleod et al. "Supramolecular Orderinng in Oligothiophene-Fullerene Monolayers" JACS, 2009, vol. 131, pp. 16844-16850.
Mattevi et al. "A review of chemical vapour deposition of graphene on copper." Journal of Materials Chemistry 21.10 (2011): 3324-3334.
Miao et al. "Chemical vapor deposition of grapheme" INTECH Open Access Publisher, 2011.
MIT/MTL Center for Graphene Devices and 2D Systems, retrieved from: http://www-mtl.mit.edu/wpmu/graphene/ [retrieved from Aug. 21, 2014 archive] (3 pages).
MIT/MTL Center for Graphene Devices and 2D Systems, retrieved from: http://www-mtl.mit.edu/Wpmu/graphene/ [retrieved from Mar. 4, 2015 archive] (3 pages).
Nafea, et al. "Immunoisolating semi-permeable membranes for cell encapsulation: focus on hydrogels." J Control Release. 154(2): 110-122 (Sep. 5, 2011).
Nezlin, "Circulating non-immune IgG complexes in health and disease," Immunol. Lett. 122(2); 141-144 (Feb. 21, 2009) (available online Feb. 2, 2009).
Norata et al., "Plasma adiponectin levels in chronic kidney disease patients: relation with molecular inflammatory profile and metabolic status," Nutr. Metab. Cardiovasc. Dis. 20(1): 56-63 (Jan. 2010) (available online Apr. 9, 2009).
Ogawa et al., "Exosome-like vesicles in Gloydius blomhoffii blomhoffii venom," Toxicon 51(6): 984-993 (May 2008) (available online Feb. 19, 2008).
Ohgawara et al. "Assessment of pore size of semipermeable membrane for immunoisolation on xenoimplatntation of pancreatic B cells using a diffusion chamber." Transplant Proc. (6): 3319-3320. 1995.
Oki et al., "Combined acromegaly and subclinical Cushing disease related to high-molecular-weight adrenocorticotropic hormone," J. Neurosurg. 110(2): 369-73 (Feb. 2009).
Osorio et al., "Effect of treatment with losartan on salt sensitivity and SGLT2 expression in hypertensive diabetic rats," Diabetes Res. Clin. Pract. 86(3): e46-e49 (Dec. 2009) (available online Oct. 2, 2009).
Osorio et al., "Effect of phlorizin on SGLT2 expression in the kidney of diabetic rats," J. Nephrol. 23(5): 541-546 (Sep.-Oct. 2010).
Padidela et al., "Elevated basal and post-feed glucagon-like peptide 1 (GLP-1) concentrations in the neonatal period," Eur. J. Endocrinol. 160(1): 53-58 (Jan. 2009) (available online Oct. 24, 2008).
Pall Corporation, "Pall Water Processing Disc-Tube Filter Technology", Retrieved on Feb. 10, 2015, Retrieved from http://www.pall.com /pdfs/Fuels-and-Chemicals/Disc- Tube_Filter_Technology-DT100b.pdF (15 Pages).
Plant et al. "Size-dependent propagation of Au nanoclusters through few-layer grapheme," The Royal Society of Chemistry 2013, Nanoscale.
Pollard, "Growing Graphene via Chemical Vapor" Department of Physics, Pomona College; May 2, 2011.
Rafael et al. "Cell Transplantation and Immunoisolation: Studies on a macroencapsultaion device." From the Departments of Transplantation Pathology: Stockholm, Sweden (1999).
Rezania et al., "Enrichment of Human Embryonic Stem Cell-Derived NKX6.1-Expressing Pancreatic Progenitor Cells Accelerates the Maturation of Insulin-Secreting Cells In Vivo", Stem Cells Regenerative Medicine, vol. 31: 2432-2442 (Jul. 29, 2013).
Rezania et al., "Maturation of Human Embryonic Stem Cell-Derived Pancreatic Progenitors Into Functional Islets Capable of Treating Pre-existing Diabetes in Mice", Diabetes Journal, vol. 61: 2016-2029 (Aug. 1, 2012).
Ribeiro et al., "Binary Mutual Diffusion Coefficients of Aqueous Solutions of Sucrose, Lactose, Glucose, and Fructose in the Temperature Range from (298.15 to 328.15) K," J. Chem. Eng. Data 51(5): 1836-1840 (Sep. 2006) (available online Jul. 20, 2006).
Rippe et al., "Size and charge selectivity of the glomerular filter in early experimental diabetes in rats," Am. J. Physiol. Renal Physiol. 293(5): F1533-F1538 (Nov. 2007)(available online Aug. 15, 2007).
SA Final Rejection for Saudi Arabia Application No. 113340400 dated Jan. 28, 2016.
SA First Examination Report for Saudi Arabia Application No. 113340401 dated Apr. 28, 2015.
SA First Examination Report for Saudi Arabia Application No. 113340424 dated May 10, 2015.
SA First Examination Report for Saudi Arabia Application No. 113340426 dated May 12, 2015.
SA First Examination Report in Saudi Arabia Application No. 113340400 dated Apr. 13, 2015.
SA Second Examination Report for Saudi Arabia Application No. 113340400 dated Aug. 11, 2015.
Sanchez, et al. "Biological Interactions of Graphene-Family Nanomaterials—An Interdisciplinary Review." Chem Res Toxicol. 25(1): 15-34 (Jan. 13, 2012).
Schweitzer, Handbook of Separation Techniques for Chemical Engineers, 1979, McGraw-Hill Book Company, pp. 2-5 to 2-8.
Search Report and Written Opinion dated Aug. 14, 2017 for Singapore Application No. 11201606287V. (10 pages).
Search Report and Written Opinion dated Aug. 22, 2017 for Singapore Application No. 11201607584P.
Sears et al., "Recent Developments in Carbon Nanotube Membranes for Water Purification and Gas Separation" Materials, vol. 3 (Jan. 4, 2010), pp. 127-149.
Sethna et al., "Serum adiponectin levels and ambulatory blood pressure monitoring in pediatric renal transplant recipients," Transplantation 88(8): 1030-1037 (Oct. 27, 2009).
Sullivan et al., "Microarray analysis reveals novel gene expression changes associated with erectile dysfunction in diabetic rats," Physiol. Genom. 23(2): 192-205 (Oct. 17, 2005) (available online Aug. 23, 2005).
Swett et al, "Imagining and Sculpting Graphene on the atomic scale" Oak Ridge National Laboratory's (ORNL) Center for Nanophase Materials Sciences (CNMS) Biannual Review. 1 page.
Swett et al, "Supersonic Nanoparticle Interaction with Suspended CVD Graphene", Microsc. Microanal. 22 (Suppl 3): 1670-1671 (Jul. 25, 2016).
Takata et al., "Hyperresistinemia is associated with coexistence of hypertension and type 2 diabetes," Hypertension 51. 2 (Feb 2008): 534-9.
Tamborlane et al., "Continuous Glucose Monitoring and Intensive Treatment of Type 1 Diabetes" N Engl J Med 359;14: 1464-1476 (Oct. 2, 2008).
Tan et al., "Beta-cell regeneration and differentiation: how close are we to the 'holy grail'?" J. Mol. Encodrinol. 53(3): R119-R129 (Oct. 9, 2014).
Tanugi et al., "Nanoporous Graphene Could Outperform Best Commercial Water Desalination Techniques," ; ACS 2012; Jun. 25, 2012; Weftec 2012; Sep. 29-Oct. 3.
Totani et al. "Gluten binds cytotoxic compounds generated in heated frying oil." Journal of oleo science 57.12 (2008): 683-690.
Tsukamoto et al. "Purification, characterization and biological activities of a garlic oliqosaccharide," Journal of UOEH 30.2 (Jun. 1, 2008): 147-57.
TW Office Action in Taiwanese Application No. 102146079 dated Apr. 14, 2017. 9 Pages. (English translation).
TW Search Report in Taiwanese Application No. 102146079 dated Apr. 14, 2017. 1 page.
UMEA Universitet "Graphene nanoscrolls are formed by decoration of magnetic nanoparticles." ScienceDaily. Aug. 15, 2013. https://www.sciencedaily.com/releases/2013/08/130815084402.htm (3 pages).
U.S. Notice of Allowance for U.S. Appl. No. 12/868,150 dated Sep. 25, 2012.
U.S. Notice of Allowance for U.S. Appl. No. 13/548,539 dated Aug. 18, 2015.
U.S. Notice of Allowance for U.S. Appl. No. 13/548,539 dated Jul. 23, 2015.

(56) References Cited

OTHER PUBLICATIONS

U.S. Notice of Allowance for U.S. Appl. No. 13/719,579 dated May 20, 2016.
U.S. Notice of Allowance for U.S. Appl. No. 13/795276 dated Oct. 7, 2016.
U.S. Notice of Allowance for U.S. Appl. No. 13/802,896 dated Apr. 1, 2015.
U.S. Notice of Allowance for U.S. Appl. No. 13/803,958 dated Aug. 29, 2016.
U.S. Notice of Allowance for U.S. Appl. No. 13/803,958 dated Jun. 2, 2016.
U.S. Notice of Allowance for U.S. Appl. No. 13/803,958 dated Sep. 12, 2016.
U.S. Notice of Allowance for U.S. Appl. No. 13/804,085 dated Jan. 15, 2015.
U.S. Notice of Allowance for U.S. Appl. No. 13/804,085 dated Mar. 12, 2015.
U.S. Notice of Allowance for U.S. Appl. No. 13/923,503 dated Oct. 14, 2016.
U.S. Notice of Allowance for U.S. Appl. No. 13/923,503 dated Oct. 5, 2016.
U.S. Notice of Allowance for U.S. Appl. No. 14/200,195 dated Jul. 5, 2016.
U.S. Notice of Allowance for U.S. Appl. No. 14/200,530 dated Aug. 1, 2016.
U.S. Notice of Allowance for U.S. Appl. No. 14/203,655 dated Dec. 9, 2016.
U.S. Notice of Allowance for U.S. Appl. No. 13/795,276 dated Jan. 19, 2017.
U.S. Notice of Allowance for U.S. Appl. No. 14/193,007 dated Sep. 6, 2017.
U.S. Notice of Allowance for U.S. Appl. No. 14/610,770 dated May 5, 2017.
U.S. Notice of Allowance for U.S. Appl. No. 14/656,580 dated May 8, 2017.
U.S. Notice of Allowance for U.S. Appl. No. 14/656,580 dated Sep. 5, 2017.
U.S. Notice of Allowance for U.S. Appl. No. 14/819,273 dated Jun. 9, 2017.
U.S. Office Action for U.S. Appl. No. 13/548,539 dated Feb. 6, 2015.
U.S. Office Action for U.S. Appl. No. 13/719,579 dated Jul. 8, 2015.
U.S. Office Action for U.S. Appl. No. 13/719,579 dated May 4, 2016.
U.S. Office Action for U.S. Appl. No. 13/795,276 dated Apr. 22, 2016.
U.S. Office Action for U.S. Appl. No. 13/795,276 dated Oct. 6, 2015.
U.S. Office Action for U.S. Appl. No. 13/802,896 dated Sep. 24, 2014.
U.S. Office Action for U.S. Appl. No. 13/803,958 dated Aug. 11, 2014.
U.S. Office Action for U.S. Appl. No. 13/803,958 dated May 28, 2015.
U.S. Office Action for U.S. Appl. No. 13/803,958 dated Nov. 18, 2015.
U.S. Office Action for U.S. Appl. No. 13/923,503 dated Mar. 22, 2016.
U.S. Office Action for U.S. Appl. No. 14/031,300 dated Jan. 20, 2016.
U.S. Office Action for U.S. Appl. No. 14/031,300 dated Jul. 7, 2015.
U.S. Office Action for U.S. Appl. No. 14/200,195 dated Mar. 21, 2016.
U.S. Office Action for U.S. Appl. No. 14/200,195 dated Nov. 4, 2015.
U.S. Office Action for U.S. Appl. No. 14/200,530 dated Feb. 29, 2016.
U.S. Office Action for U.S. Appl. No. 14/203,655 dated Aug. 10, 2016.
U.S. Office Action for U.S. Appl. No. 14/609,325 dated Aug. 25, 2017.
U.S. Office Action for U.S. Appl. No. 14/656,190 dated May 18, 2017.
U.S. Office Action for U.S. Appl. No. 14/656,657 dated Jul. 7, 2017.
U.S. Office Action for U.S. Appl. No. 14/686,452 dated Jun. 9, 2017.
U.S. Office Action for U.S. Appl. No. 14/843,944 dated Jun. 23, 2017.
U.S. Office Action for U.S. Appl. No. 14/856,471 dated May 31, 2017.
U.S. Office Action for U.S. Appl. No. 14/858,741 dated Dec. 1, 2016.
U.S. Office Action for U.S. Appl. No. 15/099,193 dated Jul. 19, 2017.
U.S. Office Action for U.S. Appl. No. 15/289,944 dated Feb. 9, 2017.
U.S. Office Action for U.S. Appl. No. 15/289,944 dated Jul. 13, 2017.
U.S. Office Action for U.S. Appl. No. 15/332,982 dated Aug. 18, 2017.
U.S. Office Action for U.S. Appl. No. 15/336,545 dated Dec. 19, 2016.
U.S. Office Action for U.S. Appl. No. 15/453,441 dated Jun. 5, 2017.
U.S. Office Action for U.S. Appl. No. 14/193,007 dated Apr. 24, 2017.
U.S. Office Action for U.S. Appl. No. 14/656,617 dated Apr. 4, 2017.
U.S. Office Action for U.S. Appl. No. 14/656,335 dated Apr. 25, 2017.
U.S. Office Action for U.S. Appl. No. 15/332,982 dated Jan. 30, 2017.
U.S. Supplemental Notice of Allowance for U.S. Appl. No. 13/795,276 dated Nov. 29, 2016.
Vallon, "Micropuncturing the nephron," Pflugers Archiv: European journal of physiology 458. 1 (May 2009): 189-201.
Van der Zande et al. "Large-scale arrays of single-layer graphene resonators." Nano letters 10.12 (2010): 4869-4873.
Verdonck, P., "Plasma Etching", in Oficina de Microfabricao: Projeto e Construcao de CI's MOS, Swart, J.W., Ed., Campinas (Sao Paulo, Brazil): Unicamp, 2006, ch. 10, p. 9.
Vlassiouk et al. "Large scale atmospheric pressure chemical vapor deposition of graphene." Carbon 54 (2013): 58-67.
Vriens et al. "Methodological considerations in quantification of oncological FDG PET studies." European journal of nuclear medicine and molecular imaging 37.7 (2010): 1408-1425.
Wang et al., "Direct Observation of a Long-Lived Single-Atom Catalyst Chiseling Atomic Structures in Graphene," Nano Lett., 2014, pp. A-F.
Wang et al., "Porous Nanocarbons: Molecular Filtration and Electronics," Advances in Graphene Science, Edited by Mahmood Aliofkhazraei, (2013) ISBN 978-953-51/1182-5, Publisher: InTech; Chapter 6, pp. 119-160.
Wang et al., "What is the role of the second "structural" NADP+-binding site in human glucose 6-phosphate dehydrogenase?," Protein science a publication of the Protein Society 17.8 (Aug 2008): 1403-11.
Wei et al., "Synthesis of N-doped graphene by chemical vapor deposition and its electrical properties", Nano Lett. 2009 9 1752-58.
Xiaogan Liang et al., Formation of Bandgap and Subbands in Graphene Nanomeshes with Sub-10nm Ribbon Width Fabricated via Nanoimprint Lithography., Nano Letters, Jun. 11, 2010, pp. 2454-2460.
Xie et al., "Fractionation and characterization of biologically-active polysaccharides from Artemisia tripartite," Phytochemistry 69. 6 (Apr. 2008): 1359-71.
Xie, et al. "Controlled fabrication of high-quality carbon nanoscrolls from monolayer graphene." Nano letters 9.7 (2009): 2565-2570.
Yagil et al. "Nonproteinuric diabetes-associated nephropathy in the Cohen rat model of type 2 diabetes" Diabetes 54.5 (May 2005): 1487-96.

(56) References Cited

OTHER PUBLICATIONS

Zan et al. "Interaction of Metals with Suspended Graphene Observed by Transmission Electron Microscopy", J. Phys. Chem. Lett., Mar. 8, 2012, 3, 953-958.
Zhang et al. "Effect of Chemical Oxidation on the Structure of Single-Walled Carbon Nanotubes", J. Phys. Chem., Feb. 12, 2003, B 107 3712-8.
Zhang et al. "Method for anisotropic etching of graphite or graphene" Institute of Physics, Chinese Academy of Sciences; PEOP. Rep. China; Mar. 30, 2011.
Zhang et al. "Production of Graphene Sheets by Direct Dispersion with Aromatic Healing Agents", Small, May 6, 2010, vol. 6, No. 10, 1100-1107.
Zhang et al. "Isolation and activity of an alpha-amylase inhibitor from white kidney beans," Yao xue xue bao =Acta pharmaceutica Sinica 42. 12 (Dec. 2007): 1282-7.
Zhao, et al. "Efficient preparation of large-area graphene oxide sheets for transparent conductive films." ACS nano 4.9 (2010): 5245-5252.
Zhou, K., et al., "One-pot preparation of graphene/ Fe3O4 composites by a solvothermal reaction," New J. Chem., 2010, 34, 2950.
Zhu et al. "Carbon Nanotubes in Biomedicine and Biosensing", Carbon Nanotubes-Growth and Applications, InTech, (Aug. 9, 2011) Chapter 6: pp. 135-162. Available from: https://www.intechopen.com/books/carbon-nanotubes-growth-and-applications/carbon-nanotubes-in-biomedicine-and-biosensing.
Ziegelmeier et al. "Adipokines influencing metabolic and cardiovascular disease are differentially regulated in maintenance hemodialysis," Metabolism: clinical and experimental 57. 10 (Oct. 2008): 1414-21.
Zirk et al. "A refractometry-based glucose analysis of body fluids," Medical engineering & physics 29. 4 (May 2007): 449-58.
Zyga "Nanoporous Graphene Could Outperform Best Commercial Water Desalination Techniques," Phys.org., Jun. 22, 2012, Retrieved from http://www.phys.org/pdf259579929.pdf [Last Accessed Dec. 3, 2014] (3 pages).
U.S. Notice of Allowance in U.S. Appl. No. 15/332,982 dated Sep. 21, 2017. (5 pages).
EPO Extended Search Report for European Application No. 171684883.5 dated Jul. 25, 2017 (8 pages).
EPO Supplementary Search Report for European Application No. 15762019.6 dated Aug. 9, 2017 (16 pages).
U.S. Notice of Allowance in U.S. Appl. No. 14/610,770 dated Sep. 26, 2017. (12 pages).
U.S. Office Action in U.S. Appl. No. 15/099,099 dated Oct. 5, 2017 (11 pages).
U.S. Office Action in U.S. Appl. No. 15/099,447 dated Oct. 3, 2017 (21 pages).
Weisen, et al., "Fabrication of nanopores in a graphene sheet with heavy ions: A molecular dynamics study", Journal of Applied Physics 114, 234304 (2013), pp. 234304-1 to 234304-6.
Chen et al., "Hierarchically porous graphene-based hybrid electrodes with excellent electrochemical performance", Journal of Materials Chemistry A: Materials for Energy and Sustainability, vol. 1, No. 33, Jan. 1, 2013, pp. 9409-9413.
European Extended Search Report in Application No. 15786691.4 dated Dec. 1, 2017 (10 pages).
European Extended Search Report in Application No. 15789852.9 dated Dec. 6, 2017 (8 pages).
Singapore Search Report and Written Opinion in Application No. 11201701654U dated Dec. 6, 2017 (6 pages).
Taiwanese Office Action in Application No. 102146079 dated Dec. 12, 2017 (with English translation) (4 pages).
U.S. Office Action in U.S. Appl. No. 14/609,325 dated Jan. 16, 2018 (11 pages).

U.S. Office Action in U.S. Appl. No. 14/656,190 dated Jan. 10, 2018 (14 pages).
U.S. Office Action in U.S. Appl. No. 14/856,471 dated Jan. 11, 2018 (36 pages).
Wang et al., "Preparation of high-surface-area carbon nanoparticle/graphene composites", Carbon, Elsevier, Oxford, GB, vol. 50, No. 10, Apr. 8, 2012, pp. 3845-3853.
Australian Office Action in Application No. 2013235234 dated Dec. 19, 2017 (5 pages).
Chu, L., et al., "Porous graphene sandwich/poly(vinylidene fluoride) composites with high dielectric properties," Composites Science and Technology, 86, (2013), pp. 70-75.
European Extended Search Report in Application No. 15743307.9 dated Nov. 15, 2017 (14 pages).
European Extended Search Report in Application No. 15755350.4 dated Oct. 30, 2017 (9 pages).
European Extended Search Report in Application No. 15762019.6 dated Nov. 20, 2017 (12 pages).
European Extended Search Report in Application No. 15762213.5 dated Oct. 10, 2017 (8 pages).
Gu et al., "One-step synthesis of porous graphene-based hydrogels containing oil droplets for drug delivery", Royal Society of Chemistry (RSC), vol. 4, No. 7, Jan. 1, 2014, pp. 3211-3218.
Japanese Office Action in Application No. 2015-549508 dated Nov. 7, 2017 (with English translation) (2 pages).
Japanese Office Action in Application No. 2017-002652 dated Nov. 24, 2017 (with English translation) (7 pages).
Kim et al., "Selective Gas Transport Through Few-Layered Graphene and Graphene Oxide Membranes", Science, vol. 342, Oct. 4, 2013, pp. 91-95 (6 total pages).
Singapore Search Report and Written Opinion in Application No. 11201609272T dated Oct. 5, 2017 (11 pages).
U.S. Notice of Allowance in U.S. Appl. No. 15/332,982 dated Nov. 1, 2017 (9 pages).
U.S. Office Action in U.S. Appl. No. 14/707,808 dated Nov. 6, 2017 (27 pages).
U.S. Office Action in U.S. Appl. No. 15/099,193 dated Dec. 28, 2017 (25 pages).
U.S. Office Action in U.S. Appl. No. 15/099,304 dated Nov. 24, 2017 (23 pages).
Wang, M., et al., "Interleaved Porous Laminate Composed of Reduced Graphene Oxide Sheets and Carbon Black Spacers by In-Situ Electrophoretic Deposition," The Royal Society of Chemistry (2014), pp. 1-3.
Wimalasiri, Y., et al., "Carbon nanotube/graphene composite for enhanced capacitive deionization performance," Carbon 59 (2013), pp. 464-471.
Chinese Office Action in Application No. 201580006829.5 dated Jan. 23, 2018 (with English translation) (13 pages).
Japanese Office Action in Application No. 2017-042023 dated Jan. 9, 2018 (with English translation) (9 pages).
U.S. Notice of Allowance in U.S. Appl. No. 14/843,944 dated Feb. 9, 2018 (9 pages).
U.S. Office Action for U.S. Appl. No. 15/099,482 dated Feb. 23, 2018 (9 pages).
U.S. Office Action in U.S. Appl. No. 15/099,099 dated Feb. 15, 2018 (13 pages).
U.S. Office Action in U.S. Appl. No. 15/099,588 dated Feb. 1, 2018 (6 pages).
Office Action for Indian Appl. Ser. No. 1566/DELNP/2013 dated Feb. 2, 2018 (7 pages).
Office Action for Japanese Appl. Ser. No. 2016-521448 dated Mar. 16, 2018 (5 pages).
U.S. Office Action for U.S. Appl. No. 15/099,276 dated Mar. 22, 2018 (13 pages).
U.S. Office Action for U.S. Appl. No. 15/453,441 dated Mar. 22, 2018 (7 pages).

* cited by examiner

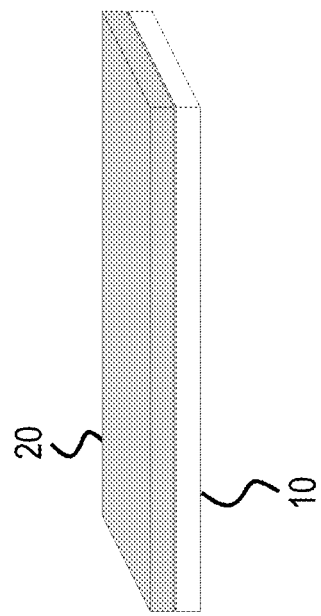
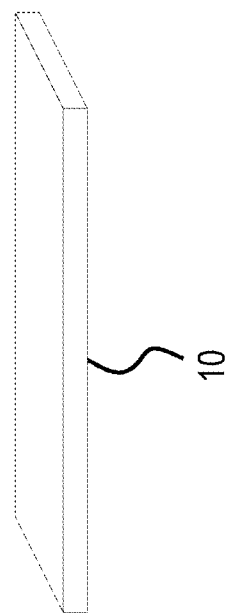
FIG. 1B
FIG. 1A

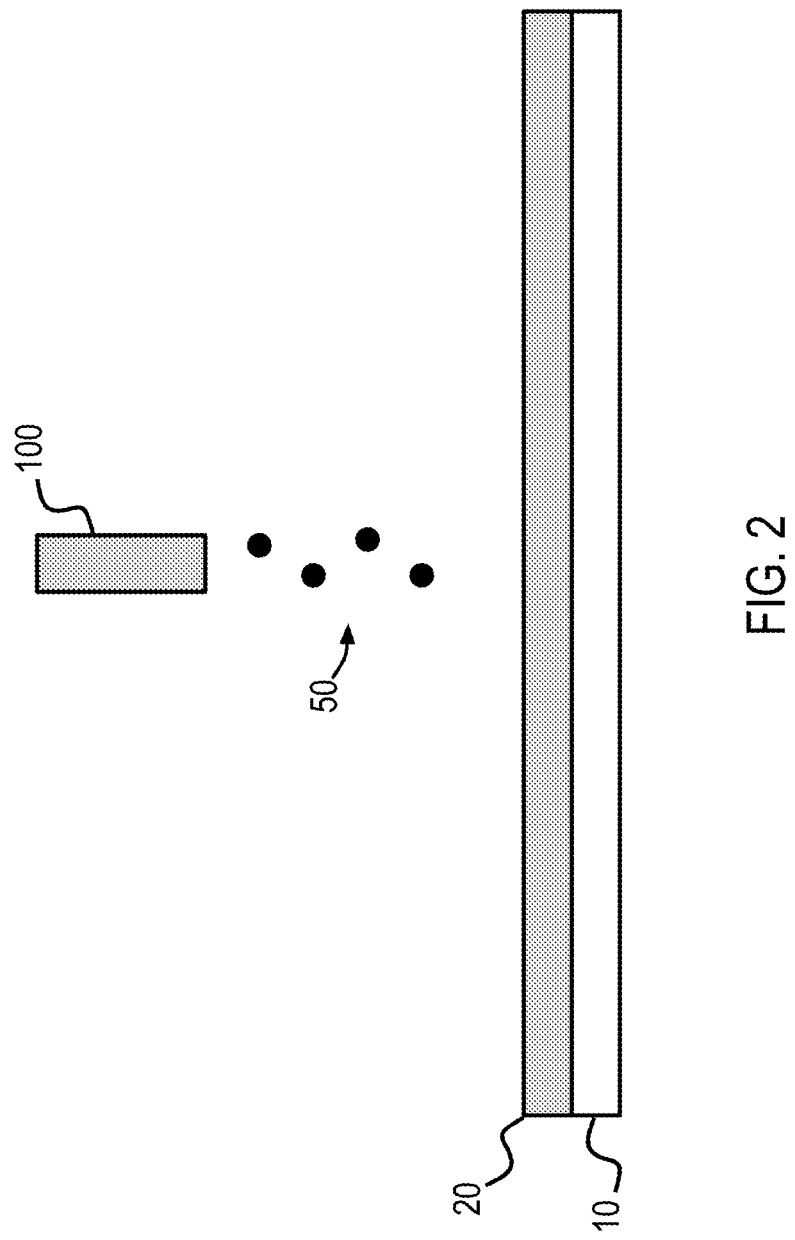

METHOD FOR TREATING GRAPHENE SHEETS FOR LARGE-SCALE TRANSFER USING FREE-FLOAT METHOD

BACKGROUND

Graphene represents a form of carbon in which the carbon atoms reside within a single atomically thin sheet or a few layered sheets (e.g., about 20 or less) of six-membered lattice rings. One known method of producing high quality, large-scale graphene sheets (i.e., 1 cm$^2$ or larger) is through chemical vapor deposition (CVD). During CVD, a growth substrate is exposed to one or more gaseous reactants, which react to deposit a carbon film on the surface of the growth substrate, resulting in the production of a graphene sheet. After growth, the graphene sheet must then be transferred to a functional substrate suitable for the intended application of the graphene sheet. To transfer the graphene sheet to the desired substrate requires separation of the graphene sheet from the growth substrate, which may result in tearing, cracking, or other substantial defects in the graphene sheet, especially in large-scale transfers in which the risk of damage is higher. In general, two methods may be used to facilitate the transfer of the graphene sheet from the growth substrate: the supported transfer method and the free-float transfer method.

The supported transfer method typically involves the use of a support polymer, such as poly(methyl methacrylate) (PMMA) or other similar polymers. In this method, the graphene is coated with PMMA and then the underlying growth substrate is etched away. The PMMA-graphene composite is then transferred to the functional substrate and mounted. Once mounted, the composite is washed with a solvent to remove the PMMA. Because this method provides a physical support to the graphene during transfer, large-scale transfer of graphene sheets is made possible. However, the use of the polymer leaves contaminants or residues on the surface of the graphene sheet. While it is possible to remove the PMMA such that the contaminants or residues are present in small amounts, even small amounts may nevertheless impact the quality of the sheet. This impact in quality, however small, may be significant in certain applications. For example, the contaminants or residues may impact the ability to reliably perforate the graphene sheet. In addition, the solvent required to remove the polymer may limit the type of functional substrate that may be used. For example, in removing PMMA, acetone is typically used. The use of this solvent, however, may prevent the use of track-etched polycarbonate as a functional substrate.

The free-float transfer method typically requires floating the graphene in a solution. During this method, the graphene-growth substrate composite is first floated in an etching solution containing an agent that etches away the growth substrate, producing a free-floating graphene sheet. The etching solution is then washed out and changed to a water-based solution to allow the graphene to be floated onto the desired substrate. As the free-float transfer method does not involve the use of secondary polymer materials to coat the graphene sheet, the free-float transfer method is desirable over the supported transfer method due to the decreased risk of introducing contaminants or leaving residue on the graphene sheet. However, large-scale transfer of the graphene sheet is difficult using this method as the risk of tearing or otherwise damaging the sheet is higher due to the unsupported nature of the transfer method.

SUMMARY

According to some embodiments, a method for transferring a graphene sheet from a copper substrate to a functional substrate may include forming the graphene sheet on the copper substrate using chemical vapor deposition, and irradiating the graphene sheet formed on the copper substrate with a plurality of xenon ions using broad beam irradiation to form a prepared graphene sheet. The prepared graphene sheet may be resistant to forming unintentional defects induced during transfer of the prepared graphene sheet to the functional substrate. The method may further include removing the copper substrate from the prepared graphene sheet using an etchant bath, floating the prepared graphene sheet in a floating bath, submerging the functional substrate in the floating bath, and decreasing a fluid level of the floating bath to lower the prepared graphene sheet onto the functional substrate.

According to some embodiments, the graphene sheet may comprise an area of 1 cm$^2$ or larger.

According to some embodiments, the broad beam irradiation may be collimated.

According to some embodiments, the plurality of xenon ions may be applied at a voltage in a range of about 100 V to about 1500 V.

According to some embodiments, the plurality of xenon ions may be applied at a voltage in a range of about 250 V to about 750 V.

According to some embodiments, the plurality of xenon ions may be applied at a voltage of about 500 V.

According to some embodiments, the method may further include the graphene sheet formed on the copper substrate to a temperature ranging from about 50° C. to about 100° C.

According to some embodiments, the method may further include heating the graphene sheet disposed on the copper substrate to a temperature of about 80° C.

According to some embodiments, the plurality of xenon ions may be provided at a flux of about $6.24 \times 10^{11}$ Xe$^+$/cm$^2$/s to about $6.24 \times 10^{14}$ Xe$^+$/cm$^2$/s.

According to some embodiments, the plurality of xenon ions may be provided at a flux of about $6.24 \times 10^{12}$ Xe$^+$/cm$^2$/s to about $6.24 \times 10^{13}$ Xe$^+$/cm$^2$/s.

According to some embodiments, the plurality of xenon ions may be provided at a flux of about $3.75 \times 10^{13}$ Xe$^+$/cm$^2$/s.

According to some embodiments, the graphene sheet formed on the copper substrate may be irradiated with the plurality of xenon ions for a contact time resulting in a total fluence of about $6.24 \times 10^{12}$ Xe$^+$/cm$^2$ to about $2.5 \times 10^{13}$ Xe$^+$/cm$^2$.

According to some embodiments, the graphene sheet formed on the copper substrate may be irradiated with the plurality of xenon ions for a contact time resulting in a total fluence of about $1.25 \times 10^{13}$ Xe$^+$/cm$^2$.

According to some embodiments, a method for transferring a graphene sheet from a copper substrate to a functional substrate may include forming the graphene sheet on the copper substrate using chemical vapor deposition and irradiating the graphene sheet formed on the copper substrate with a plurality of neon ions using broad beam irradiation to form a prepared graphene sheet. The prepared graphene sheet may be resistant to forming unintentional defects induced during transfer of the prepared graphene sheet to the functional substrate. The method may further include removing the copper substrate from the prepared graphene sheet using an etchant bath, floating the prepared graphene sheet in a floating bath, submerging the functional substrate in the floating bath, and decreasing a fluid level of the floating bath to lower the prepared graphene sheet onto the functional substrate.

According to some embodiments, the method may further include heating the graphene sheet formed on the copper substrate to a temperature of about 50° C. to about 100° C.

According to some embodiments, the graphene sheet formed on the copper substrate may be irradiated with the plurality of neon ions for a contact time resulting in a total fluence of about $6.24 \times 10^{12}$ ions/cm$^2$ to about $7.5 \times 10^{13}$ ions/cm$^2$.

According to some embodiments, the graphene sheet formed on the copper substrate may be irradiated with the plurality of neon ions for a contact time resulting in a total fluence of up to $2 \times 10^{14}$ ions/cm$^2$.

According to some embodiments, a method for transferring a graphene sheet from a growth substrate to a functional substrate may include forming the graphene sheet on the growth substrate and irradiating the graphene sheet formed on the growth substrate with a plurality of ions to form a prepared graphene sheet. The prepared graphene sheet may be resistant to forming unintentional defects induced during transfer of the prepared graphene sheet to the functional substrate. The method may further include removing the growth substrate from the prepared graphene sheet using an etchant bath, floating the prepared graphene sheet in a floating bath, submerging the functional substrate in the floating bath, and decreasing a fluid level of the floating bath to lower the prepared graphene sheet onto the functional substrate.

According to some embodiments, the graphene sheet may comprise an area of 1 cm$^2$ or larger.

According to some embodiments, the growth substrate may be a copper substrate.

According to some embodiments, the growth substrate may be a nickel substrate.

According to some embodiments, the graphene sheet may be formed on the copper substrate using chemical vapor deposition.

According to some embodiments, the graphene sheet may be formed on the nickel substrate using chemical vapor deposition.

According to some embodiments, the plurality of ions may comprise noble gas ions.

According to some embodiments, the noble gas ions may comprise xenon ions.

According to some embodiments, the noble gas ions may comprise neon ions.

According to some embodiments, the noble gas ions may comprise argon ions.

According to some embodiments, the plurality of ions may be applied to the graphene sheet formed on the growth substrate using broad beam irradiation.

According to some embodiments, the broad beam irradiation may be collimated.

According to some embodiments, the plurality of ions may be applied to the graphene sheet formed on the growth substrate at a voltage of about 100 V to about 1500 V.

According to some embodiments, the plurality of ions may be applied at a flux of about 1 nA/mm$^2$ to about 1000 nA/mm$^2$.

According to some embodiments, the plurality of ions may be applied at a flux of about 10 nA/mm$^2$ to about 100 nA/mm$^2$.

According to some embodiments, the plurality of ions may be applied at a flux of about 40 nA/mm$^2$ to about 80 nA/mm$^2$.

According to some embodiments, the plurality of ions may be applied at a flux of about 60 nA/mm$^2$.

According to some embodiments, the graphene sheet formed on the growth substrate may be irradiated with the plurality of ions for a contact time resulting in a total fluence of about 10 nAs/mm$^2$ to about 120 nAs/mm$^2$.

According to some embodiments, the graphene sheet formed on the growth substrate may be irradiated with the plurality of ions for a contact time resulting in a total fluence of about 10 nAs/mm$^2$ to about 40 nAs/mm$^2$.

According to some embodiments, the graphene sheet formed on the growth substrate may be irradiated with the plurality of ions for a contact time resulting in a total fluence of about 20 nAs/mm$^2$.

BRIEF DESCRIPTION OF THE DRAWINGS

FIG. 1A is a schematic, perspective view of a growth substrate used in the formation of a graphene sheet according to an embodiment of the present invention.

FIG. 1B is a schematic, perspective view of the graphene sheet formed on the growth substrate of FIG. 1A.

FIG. 2 is a schematic view of a transfer preparation apparatus to prepare the graphene sheet of FIG. 1B for free-float transfer.

DETAILED DESCRIPTION

Figure 3A:
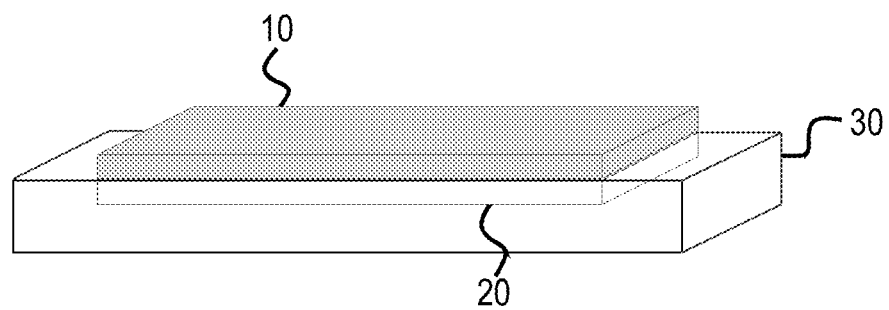
FIG. 3A is a schematic, perspective view of an etching step of the growth substrate from the prepared graphene sheet of FIG. 2 using a free-float transfer method.

Some embodiments provide a system and method for treating graphene sheet that has been grown on a growth substrate before the growth substrate is removed and the graphene sheet transferred to a functional substrate using the free-float transfer method. The treatment provides a pristine (e.g., substantially residual/contaminant-free) graphene sheet having little to no unintended defects, which is capable of being transferred from the growth substrate with reduced risk of failure (e.g., little risk of tearing, cracking, or forming other undesirable defects) in transferring the sheet to a functional substrate during the free-float transfer method. In some embodiments, the graphene sheet is modified, and thus prepared for transfer, through an application of energy to the graphene sheet while it is disposed on the growth substrate. The energetic application may be in the form of a broad beam ion source configured to irradiate the graphene sheet with ions (e.g., group 18 element ions) such that the graphene sheet is prepared for reliable, large-scale transfer while disposed on the growth substrate. Thus, some of the systems and methods described herein eliminate the need of secondary coating materials (e.g., polymers) to aid in the transfer of the graphene sheet to the functional substrate, thus eliminating the risk of lowering the quality of the graphene sheet through contaminants introduced by the use of secondary coating materials. Accordingly, the transfer preparation method of some of the embodiments allows for the reliable transfer of high quality graphene sheets on a large-scale (i.e., 1 cm$^2$ or larger) using the free-float transfer method.

FIGS. 1A-1B illustrate a method for growing a large-scale graphene or graphene-based sheet onto a growth substrate according to some embodiments. FIG. 1A shows a first step of preparing a growth substrate 10 for use in the production of a graphene sheet. The growth substrate 10 may be any growth substrate appropriate for the production of graphene. For example, in some embodiments, the growth substrate 10 is a metal catalyst, such as copper or nickel. As shown in FIG. 1A, the growth substrate 10 is a copper substrate, which is prepared by cleaning the surface with a solvent and annealing the substrate 10 at a high temperature.

After preparation of the growth substrate 10, graphene is grown on both the upper and bottom surface of the growth substrate 10, which may be accomplished through chemical vapor deposition (CVD) by exposing the growth substrate 10 to gaseous reactants until graphene is formed. The CVD process results in graphene sheets being synthesized on both a bottom surface of the growth substrate 10 and an upper surface of the growth substrate 10. As shown in FIG. 1B, the graphene sheet synthesized on the bottom surface is removed, while the graphene sheet 20 synthesized on the upper surface is utilized for transfer to a functional substrate. After growth, the graphene sheet 20 may have carbonaceous material on its surface which, in some cases, may be the result of the growth of the graphene sheet 20 on the copper substrate. The carbonaceous material may be a material such as amorphous carbon, one or more hydrocarbons, oxygen-containing carbon compounds, nitrogen-containing carbon compounds, or combinations thereof. In the embodiment shown in FIG. 1B, the graphene sheet 20 is a large-scale sheet having a cross-sectional area in the planar direction of at least 1 cm$^2$ or greater.

Once the graphene sheet 20 has been deposited onto the upper surface of the growth substrate 10, the graphene sheet 20 may then be transferred to a substrate for a desired application. As shown in FIG. 2, before the graphene sheet 20 is removed from the growth substrate 10, the graphene sheet 20 is prepared for transfer using a transfer preparation apparatus 100. The transfer preparation apparatus 100 is configured to impart energy to the graphene sheet 20 and growth substrate 10 structure. For example, the transfer preparation apparatus 100 may be configured to impart ion irradiation to the graphene sheet 20 and growth substrate 10. As shown in FIG. 2, the transfer preparation apparatus 100 may be an ion source configured to supply a plurality of ions 50 to the graphene sheet 20.

In certain embodiments, the transfer preparation apparatus 100 may be configured to provide broad beam ion irradiation to the graphene sheet 20 and the growth substrate 10. The broad beam ion source may be collimated or substantially collimated (e.g., five degrees from normal). The plurality of ions 50 may comprise of ions that are singly charged or multiply charged. In some embodiments, the plurality of ions 50 may be noble gas ions, such as ions of an element from Group 18 of the periodic table. In some embodiments, the plurality of ions 50 may be organic ions or organometallic ions. The organic or organometallic ions may have an aromatic component. In addition, the molecular mass of the organic or organometallic ions may range from 75 to 200 or 90 to 200. In some embodiments, the plurality of ions 50 may comprise Ne$^+$ ions, Ar$^+$ ions, tropylium ions, and/or ferrocenium ions. In certain embodiments, the plurality of ions 50 comprises Xe$^+$ ions.

The ion source may be configured to supply the plurality of ions 50 at a voltage in a range of about 100 V to about 1500 V. In some embodiments, the plurality of ions 50 may be applied at a voltage in a range of about 250 V to about 750 V. In certain embodiments, the plurality of ions 50 (e.g., Xe$^+$ ions) may be applied at a voltage of about 500 V.

During the transfer preparation process, the graphene sheet 20 and the growth substrate 10 may be heated to a temperature ranging from about 50° C. to about 100° C. In some embodiments, the graphene sheet 20 and the growth substrate 10 may be heated to a temperature of about 80° C. In other embodiments, the graphene sheet 20 and the growth substrate 10 may be kept at room temperature. In addition, the graphene sheet 20 and the growth substrate 10 may be exposed to a pressure of less than 5×10$^{-7}$ Torr. In some embodiments, the graphene sheet 20 and the growth substrate 10 may be exposed to a pressure ranging from 1×10$^{-7}$ Torr to 5×10$^{-6}$ Torr. In some embodiments, this process may be set to occur over several hours or overnight.

The ion source may be configured to provide the plurality of ions 50 at a flux of about 1 nA/mm$^2$ (6.24×10$^{11}$ ions/cm$^2$/s) to about 1000 nA/mm$^2$ (6.24×10$^{14}$ ions/cm$^2$/s). In some embodiments, the plurality of ions 50 is provided at a flux of about 10 nA/mm$^2$ (6.24×10$^{12}$ ions/cm$^2$/s) to about 100 nA/mm$^2$ (6.24×10$^{13}$ ions/cm$^2$/s) In certain embodiments, the plurality of ions 50 is provided at a flux of about 40 nA/mm$^2$ (2.5×10$^{13}$ ions/cm$^2$/s) to about 80 nA/mm$^2$ (5.0×10$^{13}$ ions/cm$^2$/s). In certain embodiments, the plurality of ions 50 is provided at a flux of about 60 nA/mm$^2$ (3.75×10$^{13}$ ions/cm$^2$/s). In embodiments where the plurality of ions 50 comprises Xe$^+$ ions, the plurality of ions 50 may be provided at a flux of about 6.24×10$^{11}$ Xe$^+$/cm$^2$/s to about 6.24×10$^{14}$ Xe$^+$/cm$^2$/s. In other embodiments, the plurality of ions 50 comprises Xe$^+$ ions provided at a flux of about 6.24×10$^{12}$ Xe$^+$/cm$^2$/s to about 6.24×10$^{13}$ Xe$^+$/cm$^2$/s. In other embodiments, the plurality of ions 50 comprises Xe$^+$ ions provided at a flux of about 3.75×10$^{13}$ Xe$^+$/cm$^2$/s.

The graphene sheet 20 and the growth substrate 10 may be exposed to the ion source for a contact time resulting in a total fluence of about 10 nAs/mm$^2$ (6.24×10$^{12}$ ions/cm$^2$) to about 40 nAs/mm$^2$ (2.5×10$^{13}$ ions/cm$^2$). In certain embodiments, the graphene sheet 20 and the growth substrate 10 are exposed for under a second such that the total fluence is 20 nAs/mm$^2$ (1.25×10$^{13}$ ions/cm$^2$). In embodiments where the plurality of ions comprises Xe$^+$ ions, the graphene sheet 20 and the growth substrate 10 may be exposed for a contact time that results in a total fluence of about 10 nAs/mm$^2$ to about 40 nAs/mm$^-$ (or about 6.24×10$^{12}$ Xe$^+$/cm$^2$ to about 2.5×10$^{13}$ Xe$^+$/cm$^2$). In certain embodiments where the plurality of ions 50 comprises Xe$^+$ ions, the total exposure time results in a total fluence of about 1.25×10$^{13}$ Xe$^+$/cm$^2$. The upper limit of total fluence for the transfer preparation process may increase as the atomic number of the plurality of ions 50 decreases. In some embodiments, the upper limit of the total fluence may be about 120 nAs/mm$^2$. In other embodiments, the upper limit of the total fluence may be about 500 nAs/mm$^2$. In some embodiments, the upper limit of the total fluence may be about 1000 nAs/mm$^2$. For example, in embodiments where the plurality of ions comprises Ne$^+$ ions, the graphene sheet 20 and the growth substrate 10 may be exposed for a contact time that results in a total fluence of about 10 nAs/mm$^2$ (6.24×10$^{12}$ ions/cm$^2$) to about 120 nAs/mm$^2$ (7.5×10$^{13}$ ions/cm$^2$/s). In some embodiments, the graphene sheet 20 and the growth substrate 10 may be exposed to a plurality of neon ions for a contact time that results in a total fluence of about about 10 nAs/mm$^2$ to about 500 nAs/mm$^2$ In other embodiments, the graphene sheet 20 and the growth substrate 10 may be exposed to a plurality of neon ions for a contact time that results in a total fluence of about about 10 nAs/mm$^2$ to about 1000 nAs/mm$^2$. In yet other embodiments, the graphene sheet 20 and the growth substrate 30 may be exposed to a plurality of neon ions for a contact time that results in a total fluence of up to 2×10$^{14}$ ions/cm$^2$.

After the above treatment, the graphene sheet 20 and the growth substrate 10 may be exposed to about 1 atm of N$_2$ as a final step in the process before transferring of the graphene sheet 20 to the functional substrate. The result of the preparation process is, in effect, a "toughened" graphene sheet 20 that may be reliably transferred to a functional substrate using the unsupported free-float transfer method while being resistant to forming or inducing unintentional defects (tears, cracks, wrinkles, unintentionally-created pores) in the graphene sheet 20 during the free-float transfer process. The treatment thus provides a toughened graphene sheet 20 that is capable of providing a high coverage area (e.g., 99% or more of the functional substrate is covered by the graphene sheet) over the functional substrate and a clean surface for effective use of other treatment processes (e.g., perforating processes). While not being restricted to any particular theory for the mechanism that prepares or toughens the graphene sheet 20 for transfer, the toughening may be facilitated by the presence of the carbonaceous material and the interaction between the graphene sheet 20 and the copper growth substrate 10 interface. The ion beam irradiation may provide sufficient energy to the carbonaceous material to reform the graphene sheet 20 while on the copper substrate 10 to a pristine layer due to the sputtering of the carbon atoms present in and/or on the surface of the graphene sheet 20.

Once the graphene sheet 20 has been prepared using the transfer preparation apparatus 100, the graphene sheet 20 and the growth substrate 10 composite is placed in an etchant bath 30, as shown in FIG. 3A. The etchant bath 30 allows the growth substrate 10 to be etched away such that a clean graphene sheet 20 remains. The etchant bath 30 may be any appropriate etchant capable of etching the growth substrate 10 from the graphene sheet 20. For example, for copper-based growth substrates, the etchant bath 30 may include iron chloride, iron nitrate, and/or ammonium persulfate. In some embodiments, the graphene sheet 20 and the growth substrate 10 composite may be placed in a second etchant bath 30, which may include the same or a different etchant, to further aid in the complete etching of the growth substrate 10 from the graphene sheet 20.

Figure 3B:
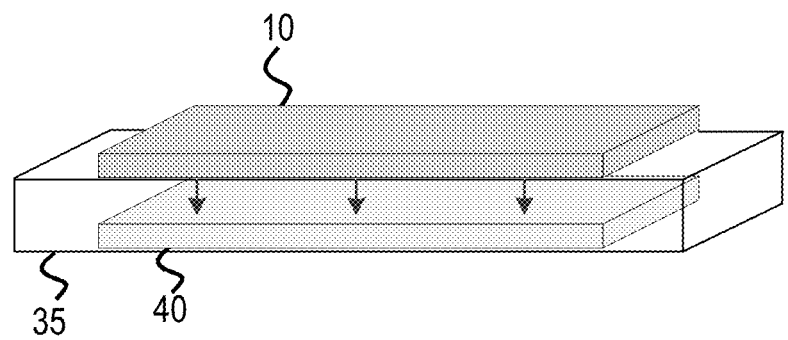
FIG. 3B is a schematic, perspective view of a transfer step of the prepared graphene sheet of FIG. 2 to a functional substrate using the free-float transfer method.

As shown in FIG. 3B, the etchant bath 30 is then gradually removed and replaced with a floating bath 35 that may serve as a floating mechanism to transfer the graphene sheet 20 to a functional substrate 40. The floating bath 35 may be a water-based solution, such as water (e.g., deionized water) or a mixture of water and a solvent (e.g., isopropyl alcohol). For example, in some embodiments, the etchant bath 30 may be removed by the gradual introduction of deionized water, which may then be additionally introduced as a mixture of deionized water and isopropyl alcohol. As the graphene sheet 20 floats in the floating bath 35, the functional substrate 40 may be introduced below a bottom surface of the graphene sheet 20, as shown in FIG. 3B. In some embodiments, a floating frame (not shown) may be disposed around the graphene sheet 20 during this process to provide stability to the graphene sheet 20 as it floats in the solution and then applied to the functional substrate 40. The floating bath 35 is then gradually removed such that the fluid level decreases to lower the graphene sheet 20 onto the substrate 40. One or more additional graphene sheets 20 that have been prepared for transfer using the transfer preparation apparatus 100 may be stacked onto the functional substrate 40 as needed using the free-float transfer method.

Figure 4:
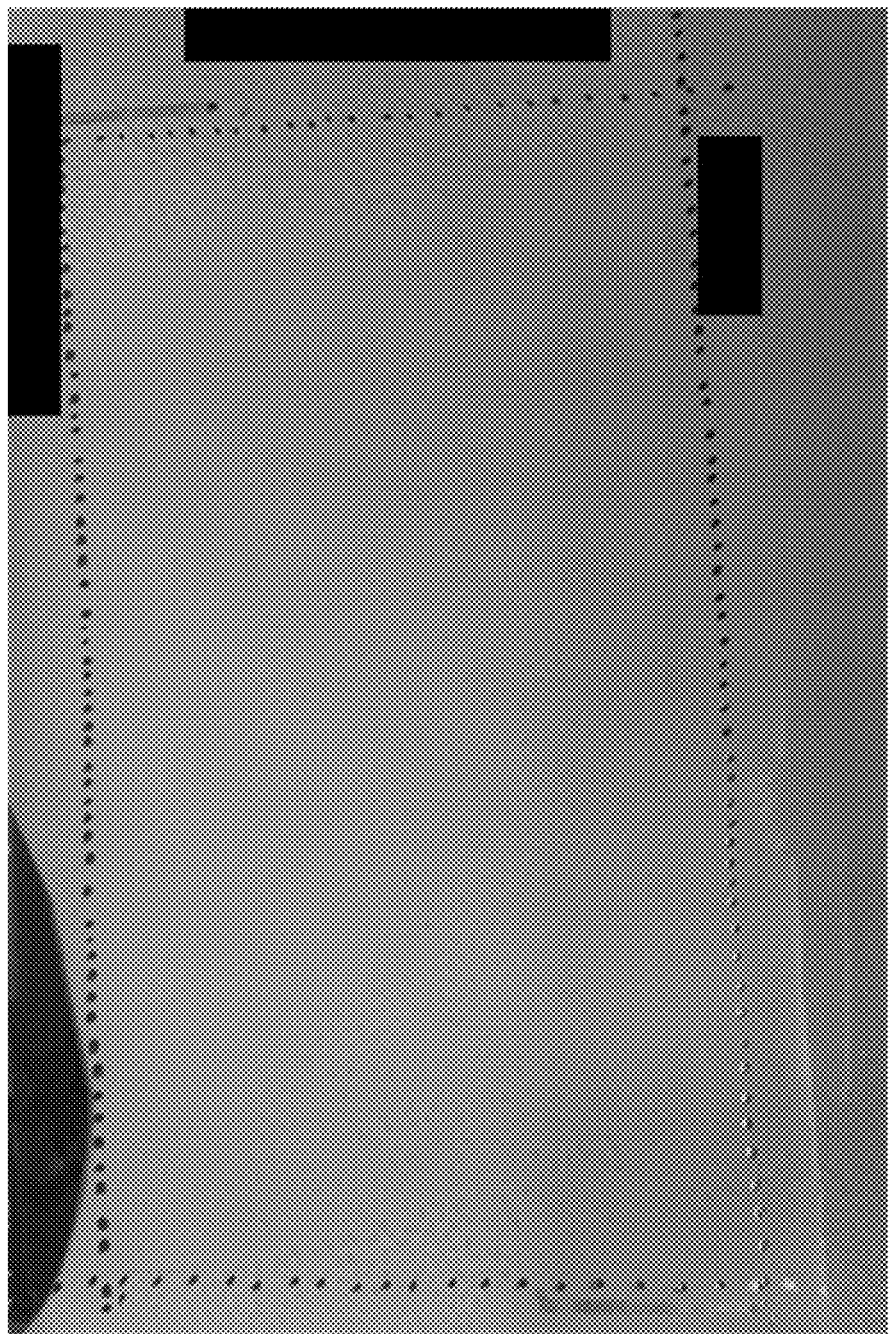
FIG. 4 shows a large-scale graphene sheet prepared using the transfer preparation apparatus of FIG. 2 after removal of the growth substrate.
Figure 5:
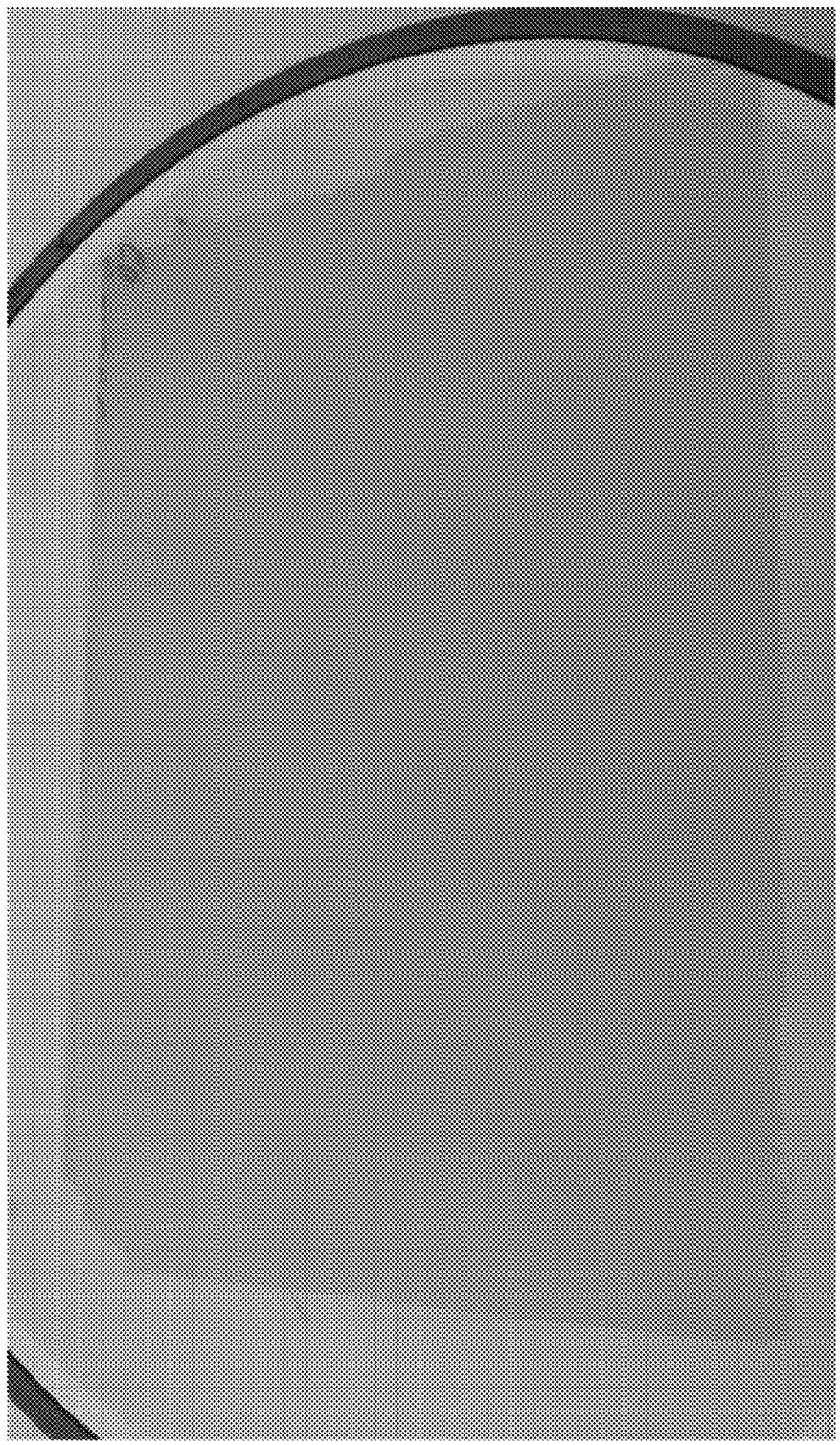
FIG. 5 shows the large-scale graphene sheet of FIG. 4 after transfer to a functional substrate using the free-float transfer method.

FIGS. 4 and 5 show images of a graphene sheet that was prepared for transfer by an embodiment of a transfer preparation apparatus configured to supply collimated broad beam ion irradiation using Xe$^+$ ions. FIG. 4 shows a prepared graphene sheet after removal of the copper growth substrate by chemical etching. The prepared graphene sheet shown in FIG. 4 is large-scale sheet having dimensions approximately 9 cm by 14 cm (or about 126 cm$^2$ extended planar area). The black circular markings shown in FIG. 4 delineate the boundaries of the graphene sheet.

FIG. 5 shows a prepared graphene sheet like that shown in FIG. 4 after it has been transferred to a functional substrate (a polymer membrane substrate in the embodiment shown in FIG. 5). Like FIG. 4, the prepared graphene sheet is a large-scale sheet having dimensions approximately 9 cm by 14 cm. As shown in FIG. 5, the graphene sheet and functional substrate composite shows a graphene sheet that is free of visible, unintentional defects. While some defects may occur along the edges due to collisions with the walls of the etchant bath tank while the sheet was free-floating, the prepared graphene sheet does not show any visible defects (e.g., visible tears, crack, or wrinkles) within the main body of the sheet even after the free-float and lowering of the graphene sheet onto the functional substrate without the use of secondary polymer support materials. This indicates that the preparation process of the graphene sheet using the transfer preparation apparatus results in a graphene sheet that is toughened to be resistant to unintentional defects that may arise during the free-float transfer process.

Figure 6:
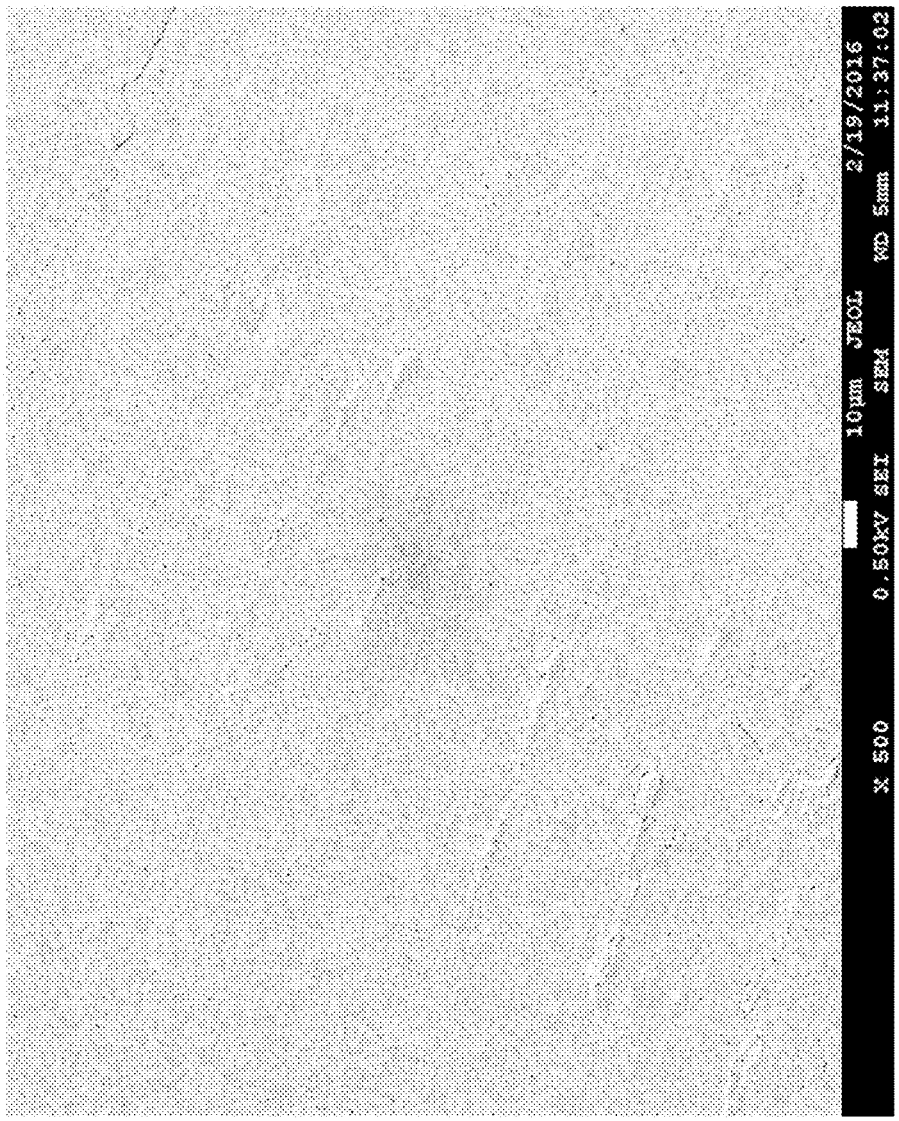
FIG. 6 is a scanning electron microscope (SEM) micrograph of a graphene sheet transferred to a functional substrate using the free-float transfer method.
Figure 7:
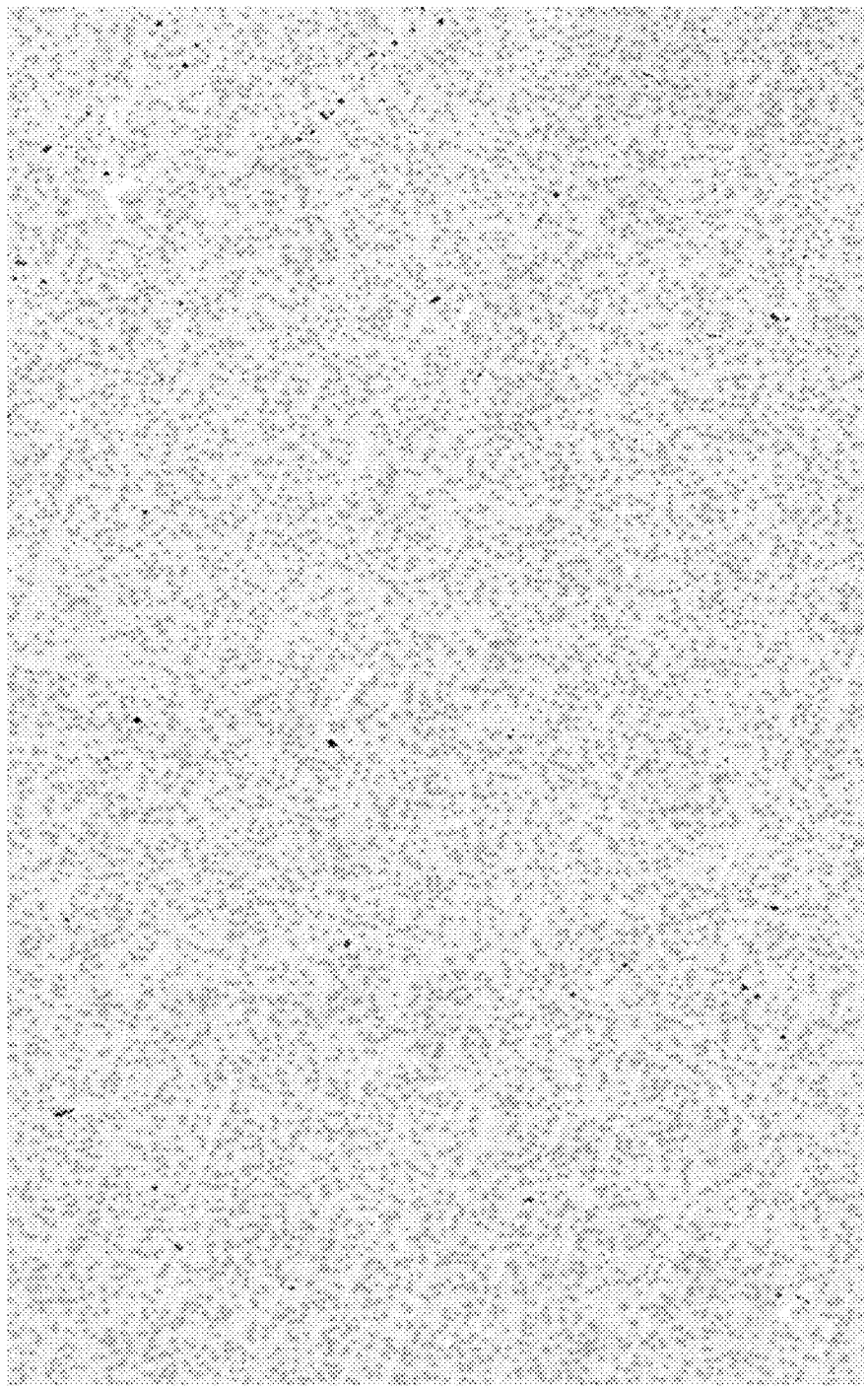
FIG. 7 is a detailed view of the SEM micrograph of FIG. 6.

FIGS. 6 and 7 show SEM images of a prepared graphene sheet that was prepared for transfer by an embodiment of a transfer preparation apparatus configured to supply collimated broad beam ion irradiation using Xe$^+$ ions. After preparation, the prepared graphene sheet was transferred to a functional substrate in the form of a track-etched polymer substrate having a plurality of pores using the free-float transfer method as described above. In the embodiment shown in the figures, the plurality of pores has a nominal pore size ranging from 350 nm to 450 nm. The total field of view shown in FIG. 6 is approximately 0.036 mm$^2$ (about 225 μm×160 μm), while FIG. 7 shows a detailed area of the top-left quadrant of the graphene sheet shown in FIG. 6.

The pores present in the polymer substrate that are covered by the prepared graphene sheet are shown as medium gray in FIGS. 6 and 7. Pores that are uncovered due to unintentional defects present in the prepared graphene sheet due to the transfer process are shown in black. As shown in FIGS. 6 and 7, greater than 99% of the substrate pores are covered by the prepared graphene sheet indicating high coverage area of the prepared graphene sheet over the polymer substrate.

Some embodiments have been described in detail with particular reference to preferred embodiments thereof, but it will be understood by those skilled in the art that variations and modifications may be effected within the spirit and scope of the claims.

What is claimed is:

1. A method for transferring a graphene sheet from a copper substrate to a functional substrate comprising:
   forming the graphene sheet on the copper substrate using chemical vapor deposition;
   irradiating the graphene sheet formed on the copper substrate with a plurality of xenon ions using broad beam irradiation to form a prepared graphene sheet;
   removing the copper substrate from the prepared graphene sheet using an etchant bath;
   floating the prepared graphene sheet in a floating bath;
   submerging the functional substrate in the floating bath; and
   decreasing a fluid level of the floating bath to lower the prepared graphene sheet onto the functional substrate.

2. The method of claim 1, wherein the graphene sheet comprises an area of 1 cm$^2$ or larger.

3. The method of claim 1, wherein the broad beam irradiation is collimated.

4. The method of claim 1, wherein the plurality of xenon ions is applied at a voltage in a range of about 100 V to about 1500 V.

5. The method of claim 1, wherein the plurality of xenon ions is applied at a voltage in a range of about 250 V to about 750 V.

6. The method of claim 1, wherein the plurality of xenon ions is applied at a voltage of about 500 V.

7. The method of claim 1, further comprising heating the graphene sheet formed on the copper substrate to a temperature ranging from about 50° C. to about 100° C.

8. The method of claim 1, further comprising heating the graphene sheet disposed on the copper substrate to a temperature of about 80° C.

9. The method of claim 1, wherein the plurality of xenon ions is provided at a flux of about $6.24\times10^{11}$ Xe$^{-1}$/cm$^2$/s to about $6.24\times10^{14}$ Xe$^+$/cm$^2$/s.

10. The method of claim 1, wherein the plurality of xenon ions is provided at a flux of about $6.24\times10^{12}$ Xe$^+$/cm$^2$/s to about $6.24\times10^{13}$ Xe$^+$/cm$^2$/s.

11. The method of claim 1, wherein the plurality of xenon ions is provided at a flux of about $3.75\times10^{13}$ Xe$^+$/cm$^2$/s.

12. The method of claim 1, wherein the graphene sheet formed on the copper substrate is irradiated with the plurality of xenon ions for a contact time resulting in a total fluence of about $6.24\times10^{12}$ Xe$^+$/cm$^2$ to about $2.5\times10^{13}$ Xe$^+$/cm$^2$.

13. The method of claim 1, wherein the graphene sheet formed on the copper substrate is irradiated with the plurality of xenon ions for a contact time resulting in a total fluence of about $1.25\times10^{13}$ Xe$^+$/cm$^2$.

14. A method for transferring a graphene sheet from a copper substrate to a functional substrate comprising:
   forming the graphene sheet on the copper substrate using chemical vapor deposition;
   irradiating the graphene sheet formed on the copper substrate with a plurality of neon ions using broad beam irradiation to form a prepared graphene sheet;
   removing the copper substrate from the prepared graphene sheet using an etchant bath;
   floating the prepared graphene sheet in a floating bath;
   submerging the functional substrate in the floating bath; and
   decreasing a fluid level of the floating bath to lower the prepared graphene sheet onto the functional substrate.

15. The method of claim 14, further comprising heating the graphene sheet formed on the copper substrate to a temperature of about 50° C. to about 100° C.

16. The method of claim 14, wherein the graphene sheet formed on the copper substrate is irradiated with the plurality of neon ions for a contact time resulting in a total fluence of about $6.24\times10^{12}$ ions/cm$^2$ to about $7.5\times10^{13}$ ions/cm$^2$.

17. The method of claim 14, wherein the graphene sheet formed on the copper substrate is irradiated with the plurality of neon ions for a contact time resulting in a total fluence of up to $2\times10^{14}$ ions/cm$^2$.

18. A method for transferring a graphene sheet from a growth substrate to a functional substrate comprising:
   forming the graphene sheet on the growth substrate;
   irradiating the graphene sheet formed on the growth substrate with a plurality of ions to form a prepared graphene sheet;
   removing the growth substrate from the prepared graphene sheet using an etchant bath;
   floating the prepared graphene sheet in a floating bath;
   submerging the functional substrate in the floating bath; and
   decreasing a fluid level of the floating bath to lower the prepared graphene sheet onto the functional substrate.

19. The method of claim 18, wherein the graphene sheet comprises an area of 1 cm$^2$ or larger.

20. The method of claim 18, wherein the growth substrate is a copper substrate.

21. The method of claim 18, wherein the growth substrate is a nickel substrate.

22. The method of claim 20, wherein the graphene sheet is formed on the copper substrate using chemical vapor deposition.

23. The method of claim 21, wherein the graphene sheet is formed on the nickel substrate using chemical vapor deposition.

24. The method of claim 18, wherein the plurality of ions comprises noble gas ions.

25. The method of claim 24, wherein the noble gas ions comprise xenon ions.

26. The method of claim 24, wherein the noble gas ions comprise neon ions.

27. The method of claim 24, wherein the noble gas ions comprise argon ions.

28. The method of claim 18, wherein the plurality of ions is applied to the graphene sheet formed on the growth substrate using broad beam irradiation.

29. The method of claim 28, wherein the broad beam irradiation is collimated.

30. The method of claim 18, wherein the plurality of ions is applied to the graphene sheet formed on the growth substrate at a voltage of about 100 V to about 1500 V.

31. The method of claim 18, wherein the plurality of ions is applied at a flux of about 1 nA/mm$^2$ to about 1000 nA/mm$^2$.

32. The method of claim 18, wherein the plurality of ions is applied at a flux of about 10 nA/mm$^2$ to about 100 nA/mm$^2$.

33. The method of claim 18, wherein the plurality of ions is applied at a flux of about 40 nA/mm$^2$ to about 80 nA/mm$^2$.

34. The method of claim 18, wherein the plurality of ions is applied at a flux of about 60 nAs/mm$^2$.

35. The method of claim 18, wherein the graphene sheet formed on the growth substrate is irradiated with the plurality of ions for a contact time resulting in a total fluence of about 10 nAs/mm$^2$ to about 120 nAs/mm$^2$.

36. The method of claim 18, wherein the graphene sheet formed on the growth substrate is irradiated with the plurality of ions for a contact time resulting in a total fluence of about 10 nAs/mm² to about 40 nAs/mm².

37. The method of claim 18, wherein the graphene sheet formed on the growth substrate is irradiated with the plurality of ions for a contact time resulting in a total fluence of about 20 nAs/mm².

\* \* \* \* \*